(12) United States Patent
Kim et al.

(10) Patent No.: US 11,013,150 B2
(45) Date of Patent: May 18, 2021

(54) ELECTRONIC DEVICE COMPRISING HEAT DISSIPATION STRUCTURE

(71) Applicant: Samsung Electronics Co., Ltd., Gyeonggi-do (KR)

(72) Inventors: Min-Soo Kim, Gyeongsangbuk-do (KR); Ji-Woo Lee, Gyeongsangbuk-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/610,986

(22) PCT Filed: May 15, 2018

(86) PCT No.: PCT/KR2018/005538
§ 371 (c)(1),
(2) Date: Nov. 5, 2019

(87) PCT Pub. No.: WO2018/212549
PCT Pub. Date: Nov. 22, 2018

(65) Prior Publication Data
US 2020/0178415 A1    Jun. 4, 2020

(30) Foreign Application Priority Data

May 18, 2017 (KR) .................. 10-2017-0061795

(51) Int. Cl.
*H05K 7/20* (2006.01)
*H05K 7/14* (2006.01)
(Continued)

(52) U.S. Cl.
CPC ........... *H05K 7/205* (2013.01); *H05K 1/0207* (2013.01); *H05K 1/181* (2013.01); *H05K 7/1427* (2013.01);
(Continued)

(58) Field of Classification Search
CPC .. H05K 9/0032; H05K 1/0204; H05K 1/0216; H05K 9/0026; H05K 9/003;
(Continued)

(56) References Cited

U.S. PATENT DOCUMENTS

| 5,133,403 A | 7/1992 | Yokono et al. |
| 5,724,234 A * | 3/1998 | Phelps ................. H05K 9/0026 174/357 |

(Continued)

FOREIGN PATENT DOCUMENTS

| JP | 2507561 B2 | 6/1996 |
| JP | 2009-60048 A | 3/2009 |

(Continued)

*Primary Examiner* — Binh B Tran
*Assistant Examiner* — Michael A Matey
(74) *Attorney, Agent, or Firm* — Cha & Reiter, LLC

(57) ABSTRACT

An electronic device, according to various embodiments of the present invention, may comprise: a housing which comprises a first surface, a second surface facing the opposite direction from the first surface, and a cooling member arranged between the first surface and the second surface; a circuit board which is disposed inside the housing; at least one heating component which is mounted to the circuit board; a shield can which surrounds one portion of the at least one heating component; a conductive member which makes contact with a first surface of the at least one heating component; a first thermal conduction member which diffuses heat from the at least one heating component to a plane direction parallel with the first surface of the heating component; and a second thermal conduction member which makes contact with a first surface of the first thermal conduction member, receives the heat from the first thermal conduction member in a second direction perpendicular to the plane direction, and transfers the heat to the cooling member. In addition, various embodiments are possible.

18 Claims, 15 Drawing Sheets

(51) Int. Cl.
*H05K 9/00* (2006.01)
*H05K 1/02* (2006.01)
*H02K 1/18* (2006.01)
*H05K 1/18* (2006.01)

(52) U.S. Cl.
CPC . *H05K 9/0024* (2013.01); *H05K 2201/10371* (2013.01)

(58) Field of Classification Search
CPC ............... H05K 1/0203; H05K 1/181; H05K 2201/10371; H05K 2201/2018; H05K 9/0024; H05K 9/0084; G06F 1/20
See application file for complete search history.

(56) References Cited

U.S. PATENT DOCUMENTS

| | | | | |
|---|---|---|---|---|
| 6,853,093 | B2* | 2/2005 | Cohen | H01L 23/576 257/678 |
| 8,477,499 | B2* | 7/2013 | Hill | H05K 7/2039 361/707 |
| 9,224,672 | B1 | 12/2015 | Pykari et al. | |
| 9,363,884 | B2* | 6/2016 | Yang | H05K 7/20472 |
| 10,141,625 | B1* | 11/2018 | Ryu | H01Q 1/02 |
| 2002/0185294 | A1* | 12/2002 | Shlyakhtichman | H05K 9/0032 174/384 |
| 2003/0161132 | A1* | 8/2003 | Shimoji | H01L 23/433 361/800 |
| 2003/0193794 | A1* | 10/2003 | Reis | H05K 9/003 361/816 |
| 2009/0057004 | A1 | 3/2009 | Watanabe | |
| 2009/0207578 | A1* | 8/2009 | Ligtenberg | G06F 1/1616 361/818 |
| 2014/0002989 | A1* | 1/2014 | Ahuja | G06F 1/20 361/679.54 |
| 2014/0055957 | A1 | 2/2014 | Yang et al. | |
| 2015/0208550 | A1* | 7/2015 | Rugg | G11B 33/142 361/713 |
| 2015/0245543 | A1* | 8/2015 | Jang | H05K 9/0032 361/760 |
| 2015/0264842 | A1* | 9/2015 | Song | H05K 7/20445 361/714 |
| 2015/0282392 | A1* | 10/2015 | Liu | G06F 1/203 361/707 |
| 2016/0044835 | A1* | 2/2016 | Lee | H05K 9/0032 361/760 |
| 2016/0301442 | A1* | 10/2016 | Sohn | H04M 1/19 |
| 2017/0111989 | A1* | 4/2017 | Wang | H05K 1/0212 |
| 2017/0238442 | A1* | 8/2017 | Zhang | H05K 7/2099 455/550.1 |
| 2017/0367175 | A1* | 12/2017 | Lai | H05K 7/20445 |
| 2018/0110158 | A1* | 4/2018 | Talpallikar | F28F 21/084 |
| 2018/0228063 | A1* | 8/2018 | Dixon | H01L 23/552 |
| 2018/0288908 | A1* | 10/2018 | Lee | H05K 7/20454 |
| 2019/0364695 | A1* | 11/2019 | Lee | F28D 15/0233 |
| 2020/0100389 | A1* | 3/2020 | Park | H05K 7/20336 |
| 2020/0128690 | A1* | 4/2020 | Ide | H05K 7/20963 |
| 2020/0254721 | A1* | 8/2020 | Lee | H05K 9/0026 |

FOREIGN PATENT DOCUMENTS

| | | |
|---|---|---|
| JP | 2016-81978 A | 5/2016 |
| KR | 10-1459223 B1 | 11/2014 |
| KR | 10-2015-0108262 A | 9/2015 |
| KR | 10-2016-0009914 A | 1/2016 |

* cited by examiner

ELECTRONIC DEVICE COMPRISING HEAT DISSIPATION STRUCTURE

CROSS-REFERENCE TO RELATED APPLICATION(S)

This application is a National Phase Entry of PCT International Application No. PCT/KR2018/005538, which was filed on May 15, 2018, and claims priority to Korean Patent Application No. 10-2017-0061795, which was filed on May 18, 2017, the contents of which are incorporated herein by reference.

BACKGROUND

1. Field

Various embodiments of the present invention relate to a heat dissipation structure and an electronic device including the heat dissipation structure.

2. Description of the Related Art

A processor of an electronic device is a main factor to determine the performance of the electronic device. As the performance of the processor increases, the processor consumes more power and may thus cause heating issues or high-frequency electromagnetic waves. With the design of high-performance processors and the trend to make electronic devices more compact in structure, design of heat-dissipation structures and shielding structures for processors may be a major factor in the performance of electronic devices.

SUMMARY

A processor of an electronic device may be designed so that its performance is limited by the temperature of the electronic device. For example, in a case where a high-definition video is played, the temperature of the processor is measured and, if the temperature exceeds a reference temperature, the performance of the processor may be limited by lowering the clock frequency of the present invention.

If the processor or heating components of the electronic device are overheated, the performance of the heating components may be deteriorated and, if more current is applied to stay at the same performance, more heat may occur in the heating components.

If the heat from the processor of the electronic device directly transfers to the surface of the housing of the electronic device, heat may concentrate onto the area of the surface of the housing, which corresponds to the position of the processor the so-called 'hot spot.'

According to various embodiments of the present invention, there is provided a heat dissipation structure and electronic device including the same, which may smoothly dissipate heat generated from heating components (e.g., a processor) of the electronic device.

According to various embodiments of the present invention, an electronic device comprises a housing including a first surface, a second surface facing away from the first surface, and a cooling member disposed between the first surface and the second surface, a circuit board disposed inside the housing, at least one heating component mounted on the circuit board, a shield can surrounding part of the at least one heating component, a conducting member contacting a first surface of the at least one heating component, a first heat conducting member dissipating heat from the at least one heating component to a plane direction parallel with the first surface of the heating component, and a second heat conducting member contacting a first surface of the first heat conducting member, receiving the heat from the first heat conducting member in a second direction perpendicular to the plane direction, and transferring the heat to the cooling member.

According to various embodiments of the present invention, a heat dissipation structure included in an electronic device comprises a circuit board on which at least one heating component of the electronic device is disposed, a shield can surrounding part of the at least one heating component, a conducting member contacting a first surface of the at least one heating component, a first heat conducting member dissipating heat from the at least one heating component to a plane direction parallel with the first surface of the heating component, and a second heat conducting member contacting a first surface of the first heat conducting member, receiving the heat from the first heat conducting member, and transferring the heat to a cooling member of the electronic device. According to an embodiment, the heat dissipation structure may further comprise a third heat conducting member contacting the second heat conducting member and dissipating the heat received from the second heat conducting member in the plane direction.

According to various embodiments of the present invention, a method of assembling an electronic device comprises allowing a conducting member to contact a first surface of at least one heating component and a first surface of a shield can using the shield can surrounding part of the at least one heating component of the electronic device, stacking a first heat conducting member on the conducting member, the first heat conducting member dissipating heat from the at least one heating component in a first direction, allowing a second heat conducting member to contact a first surface of the first heat conducting member, disposing a third heat conducting member on a first surface of the second heat conducting member, and assembling the at least one heating component, the conducting member, the second heat conducting member, and the third heat conducting member in the housing of the electronic device, with the at least one heating component, the conducting member, the second heat conducting member, and the third heat conducting member stacked one over another.

According to various embodiments of the present invention, a heat dissipation structure included in an electronic device may transfer heat produced from at least one heating component to the housing, thereby reducing the likelihood that a hot spot is caused on the surface of the housing by heat produced from at least one heating component.

DETAILED DESCRIPTION

Figure 1:
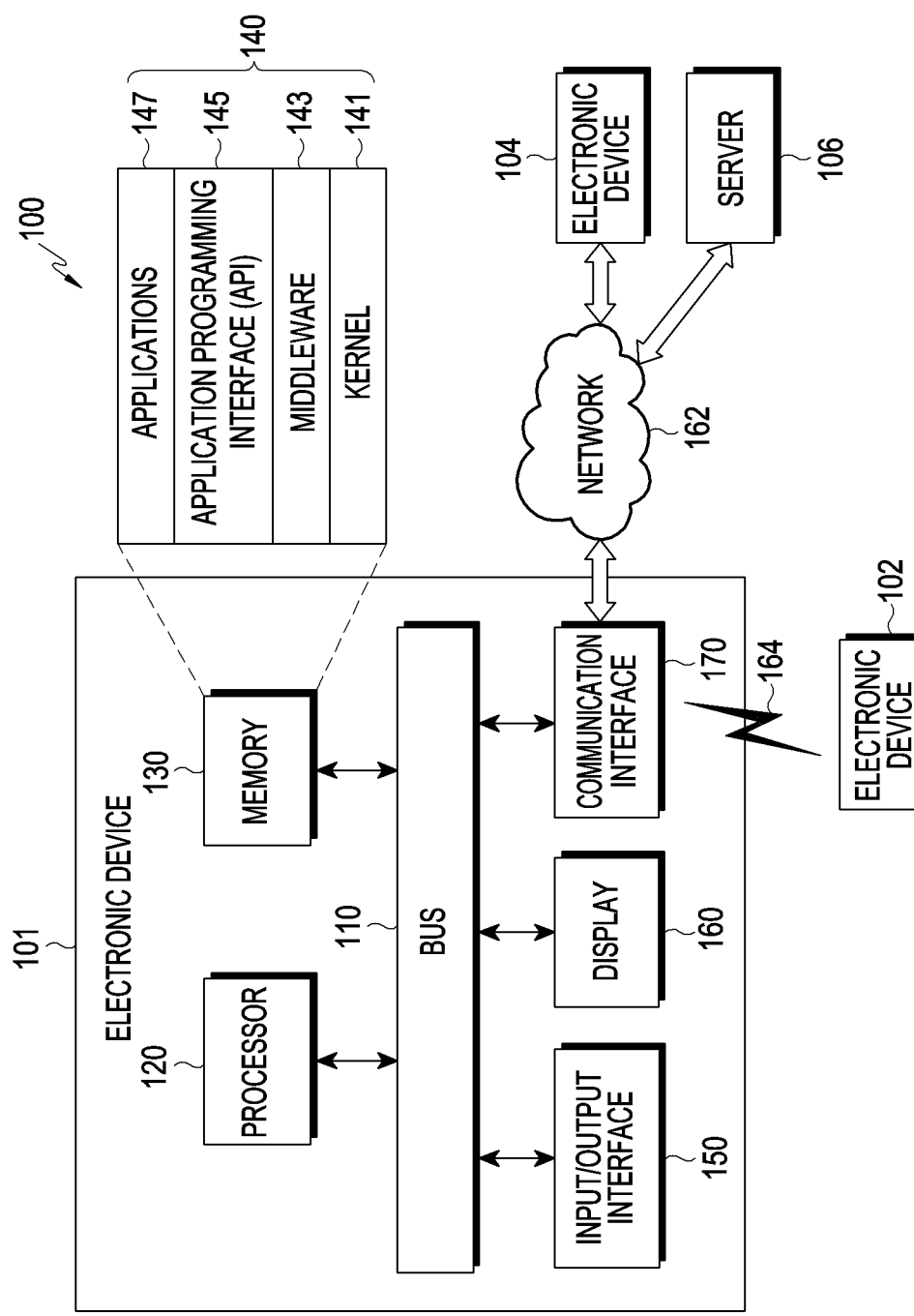
FIG. 1 is a view schematically illustrating an electronic device in a network environment according to various embodiment of the present invention.

Hereinafter, embodiments of the present disclosure are described with reference to the accompanying drawings. However, it should be appreciated that the present disclosure is not limited to the embodiments and the terminology used herein, and all changes and/or equivalents or replacements thereto also belong to the scope of the present disclosure. The same or similar reference denotations may be used to refer to the same or similar elements throughout the specification and the drawings. It is to be understood that the singular forms "a," "an," and "the" include plural references unless the context clearly dictates otherwise. As used herein, the terms "A or B" or "at least one of A or B" may include all possible combinations of A and B. As used herein, the terms "first" and "second" may modify various components regardless of importance and/or order and are used to distinguish a component from another without limiting the components. It will be understood that when an element (e.g., a first element) is referred to as being (operatively or communicatively) "coupled with/to," or "connected with/to" another element (e.g., a second element), it can be coupled or connected with/to the other element directly or via a third element.

As used herein, the terms "configured to" may be interchangeably used with other terms, such as "suitable for," "capable of," "modified to," "made to," "adapted to," "able to," or "designed to" in hardware or software in the context. Rather, the term "configured to" may mean that a device can perform an operation together with another device or parts. For example, the term "processor configured (or set) to perform A, B, and C" may mean a generic-purpose processor (e.g., a CPU or application processor) that may perform the operations by executing one or more software programs stored in a memory device or a dedicated processor (e.g., an embedded processor) for performing the operations.

For example, examples of the electronic device according to embodiments of the present disclosure may include at least one of a smartphone, a tablet personal computer (PC), a mobile phone, a video phone, an e-book reader, a desktop PC, a laptop computer, a netbook computer, a workstation, a server, a personal digital assistant (PDA), a portable multimedia player (PMP), an MP3 player, a medical device, a camera, or a wearable device. The wearable device may include at least one of an accessory-type device (e.g., a watch, a ring, a bracelet, an anklet, a necklace, glasses, contact lenses, or a head-mounted device (HMD)), a fabric- or clothes-integrated device (e.g., electronic clothes), a body attaching-type device (e.g., a skin pad or tattoo), or a body implantable device. In some embodiments, examples of the smart home appliance may include at least one of a television, a digital video disk (DVD) player, an audio player, a refrigerator, an air conditioner, a cleaner, an oven, a microwave oven, a washer, a dryer, an air cleaner, a set-top box, a home automation control panel, a security control panel, a TV box (e.g., Samsung HomeSync™, Apple TV™, or Google TV™), a gaming console (Xbox™, PlayStation™), an electronic dictionary, an electronic key, a camcorder, or an electronic picture frame.

According to an embodiment of the present disclosure, the electronic device may include at least one of various medical devices (e.g., diverse portable medical measuring devices (a blood sugar measuring device, a heartbeat measuring device, or a body temperature measuring device), a magnetic resource angiography (MRA) device, a magnetic resource imaging (MRI) device, a computed tomography (CT) device, an imaging device, or an ultrasonic device), a navigation device, a global navigation satellite system (GNSS) receiver, an event data recorder (EDR), a flight data recorder (FDR), an automotive infotainment device, sailing electronic device (e.g., a sailing navigation device or a gyro compass), avionics, security devices, vehicular head units, industrial or home robots, drones, automatic teller's machines (ATMs), point of sales (POS) devices, or internet of things (IoT) devices (e.g., a bulb, various sensors, a sprinkler, a fire alarm, a thermostat, a street light, a toaster, fitness equipment, a hot water tank, a heater, or a boiler).

According to various embodiments of the disclosure, examples of the electronic device may at least one of part of a piece of furniture, a building/structure or vehicle, an electronic board, an electronic signature receiving device, a projector, or various measurement devices (e.g., devices for measuring water, electricity, gas, or electromagnetic waves). According to embodiments of the present invention, the electronic device may be flexible or may be a combination of the above-enumerated electronic devices. According to an embodiment of the disclosure, the electronic devices are not limited to those described above. According to an embodiment, the term "user" may denote a human or another device (e.g., an artificial intelligent electronic device) using the electronic device.

FIG. 1 is a view schematically illustrating an electronic device in a network environment according to various embodiments of the present invention.

Referring to FIG. 1, according to various embodiments, an electronic device 10 is included in a network environment 101. The electronic device 101 may include a bus 110, a processor 120, a memory 130, an input/output interface 150, a display 160, and a communication interface 170. In some embodiments, the electronic device 101 may exclude at least one of the components or may add another component. The bus 110 may include a circuit for connecting the components 110 to 170 with one another and transferring communications (e.g., control messages or data) between the components. The processor 120 may include one or more of a central processing unit (CPU), an application processor (AP), or a communication processor (CP). The processor 120 may perform control on at least one of the other components of the electronic device 101, or perform an operation or data processing relating to communication.

The memory 130 may include a volatile or non-volatile memory. For example, the memory 130 may store commands or data related to at least one other component of the electronic device 101. According to an embodiment of the present disclosure, the memory 130 may store software or a program 140. The program 140 may include, e.g., a kernel 141, middleware 143, an application programming interface (API) 145, or an application program (or "application") 147. At least a portion of the kernel 141, middleware 143, or API 145 may be denoted an operating system (OS). For example, the kernel 141 may control or manage system resources (e.g., the bus 110, processor 120, or a memory 130) used to perform operations or functions implemented in other programs (e.g., the middleware 143, API 145, or application program 147). The kernel 141 may provide an interface that allows the middleware 143, the API 145, or the application 147 to access the individual components of the electronic device 101 to control or manage the system resources.

The middleware 143 may function as a relay to allow the API 145 or the application 147 to communicate data with the kernel 141, for example. Further, the middleware 143 may process one or more task requests received from the application program 147 in order of priority. For example, the middleware 143 may assign a priority of using system resources (e.g., bus 110, processor 120, or memory 130) of the electronic device 101 to at least one of the application programs 147 and process one or more task requests. The API 145 is an interface allowing the application 147 to control functions provided from the kernel 141 or the middleware 143. For example, the API 133 may include at least one interface or function (e.g., a command) for filing control, window control, image processing or text control. For example, the input/output interface 150 may transfer commands or data input from the user or other external device to other component(s) of the electronic device 101 or may output commands or data received from other component(s) of the electronic device 101 to the user or other external devices.

The display 160 may include, e.g., a liquid crystal display (LCD), a light emitting diode (LED) display, an organic light emitting diode (OLED) display, or a microelectromechanical systems (MEMS) display, an electronic paper display, or a touchscreen display. The display 160 may display, e.g., various contents (e.g., text, images, videos, icons, or symbols) to the user. The display 160 may include a touchscreen display and may receive, e.g., a touch, gesture, proximity or hovering input using an electronic pen or a body portion of the user.

For example, the communication interface 170 may set up communication between the electronic device 101 and an external device (e.g., a first electronic device 102, a second electronic device 104, or a server 106). For example, the communication interface 170 may be connected with a network 162 through wireless communication or wired communication and may communicate with an external device (e.g., the second external electronic device 104 or server 106). The wireless communication circuit may include the communication interface 170.

The wireless communication may include cellular communication which uses at least one of, e.g., long term evolution (LTE), long term evolution-advanced (LTE-A), code division multiple access (CDMA), wideband code division multiple access (WCDMA), universal mobile telecommunication system (UMTS), wireless broadband (Wi-Bro), or global system for mobile communication (GSM). According to an embodiment of the present invention, the wireless communication may include at least one of, e.g., wireless-fidelity (Wi-Fi), light-fidelity (Li-Fi), Bluetooth, Bluetooth low power (BLE), ZigBee, near-field communication (NFC), magnetic secure transmission (MST), radio frequency (RF), or body area network (BAN) as denoted with denotation 164 of FIG. 1. According to an embodiment of the present invention, the wireless communication may include global navigation satellite system (GNSS). The GNSS may be, e.g., global positioning system (GPS), global navigation satellite system (Glonass), Beidou navigation satellite system (hereinafter, "Beidou") or Galileo, or the European global satellite-based navigation system. Hereinafter, the terms "GPS" and the "GNSS" may be interchangeably used herein. The wired connection may include at least one of, e.g., universal serial bus (USB), high definition multimedia interface (HDMI), recommended standard (RS)-232, power line communication (PLC), or plain old telephone service (POTS). The network 162 may include at least one of telecommunication networks, e.g., a computer network (e.g., local area network (LAN) or wide area network (WAN)), Internet, or a telephone network.

The first and second external electronic devices 102 and 104 each may be a device of the same or a different type from the electronic device 101. According to an embodiment of the present disclosure, all or some of operations executed on the electronic device 101 may be executed on another or multiple other electronic devices (e.g., the electronic devices 102 and 104 or server 106). According to an embodiment, when the electronic device 101 should perform some function or service automatically or at a request, the electronic device 101, instead of executing the function or service on its own or additionally, may request another device (e.g., electronic devices 102 and 104 or server 106) to perform at least some functions associated therewith. The other electronic device (e.g., electronic devices 102 and 104 or server 106) may execute the requested functions or additional functions and transfer a result of the execution to the electronic device 101. The electronic device 101 may provide a requested function or service by processing the received result as it is or additionally. To that end, a cloud computing, distributed computing, or client-server computing technology may be used, for example.

Figure 2:
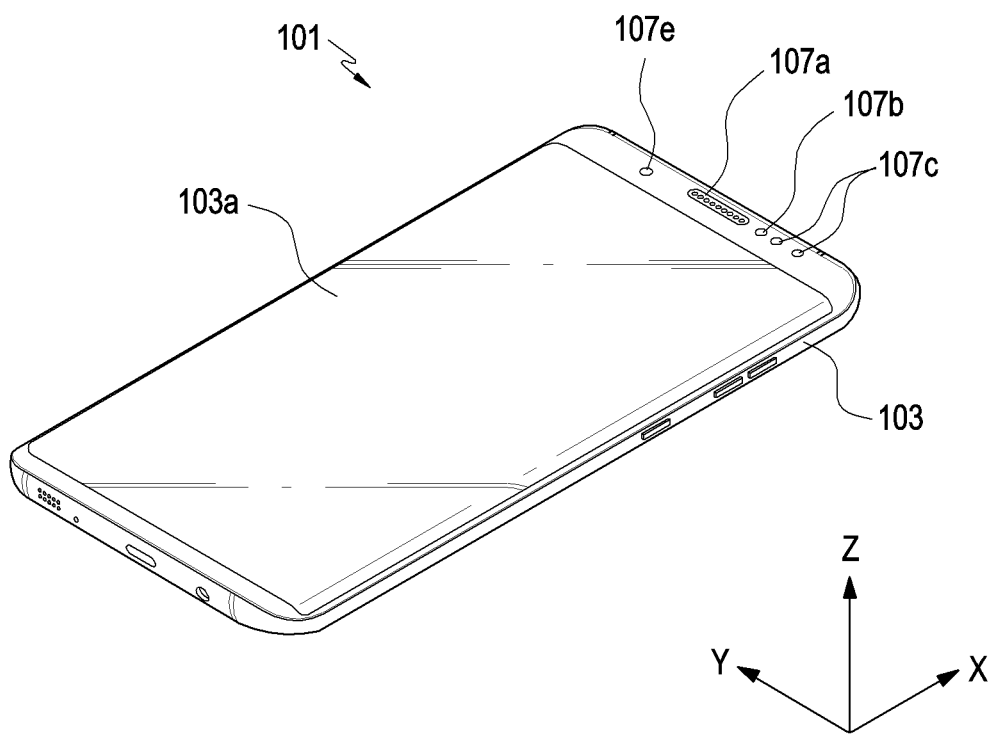
FIG. 2 is a front perspective view illustrating an electronic device according to various embodiments of the present invention.
Figure 3:
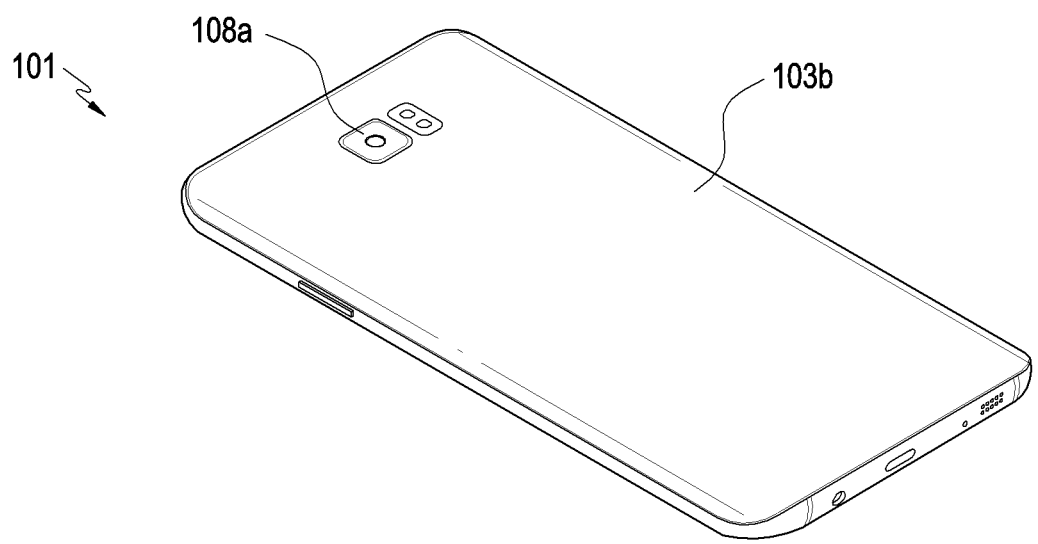
FIG. 3 is a rear perspective view illustrating an electronic device according to various embodiments of the present invention.

FIG. 2 is a front perspective view illustrating an electronic device (e.g., the electronic device 101 of FIG. 1) according to various embodiments of the present invention. FIG. 3 is a rear perspective view illustrating an electronic device according to various embodiments of the present invention.

In the three-axis rectangular coordinate system as shown in FIG. 2, 'X,' 'Y,' and 'Z,' respectively, may denote the width, length, and thickness direction of the electronic device 101.

Referring to FIGS. 2 and 3, the electronic device 101 may include a housing 103. The housing 10 may include a first surface 103a facing in the first direction +Z, a first surface 103b facing in the second direction −Z which is opposite to the first direction +Z, and a side member surrounding a space between the first surface 103a and the first surface 103b.

The housing 103 may have a front opening. A transparent cover may be provided to form at least part of the front surface 103a, closing the front opening of the front surface of the housing 103. According to an embodiment, the transparent cover may be disposed over the whole front surface of the electronic device 101 as viewed from above the first surface 103a.

According to an embodiment of the present invention, a keypad with mechanical buttons or touch keys may be provided in a lower area of the front surface (e.g., the first surface 103a) of the housing 103. The touch keys may generate input signals as they are touched by the user's body. According to an embodiment of the present invention, the keypad may be implemented to include only mechanical buttons or only the touch keys. Various circuit devices, e.g., the processor 120, the memory 130, the input/output interface 150, and the communication interface 170 described above, may be received inside the housing 103. A battery 109 may also be received in the housing 210 to secure power.

According to an embodiment of the present invention, a speaker 107e, a first camera 107a, an illumination sensor 107b, or a proximity sensor 107c may be provided in an upper area of the front surface (e.g., the first surface 103a) of the electronic device 103. According to an embodiment of the present invention, a second camera 108a, a flash, or a speaker may be provided in the rear surface (e.g., the front surface 103b) of the housing 103.

Figure 4:
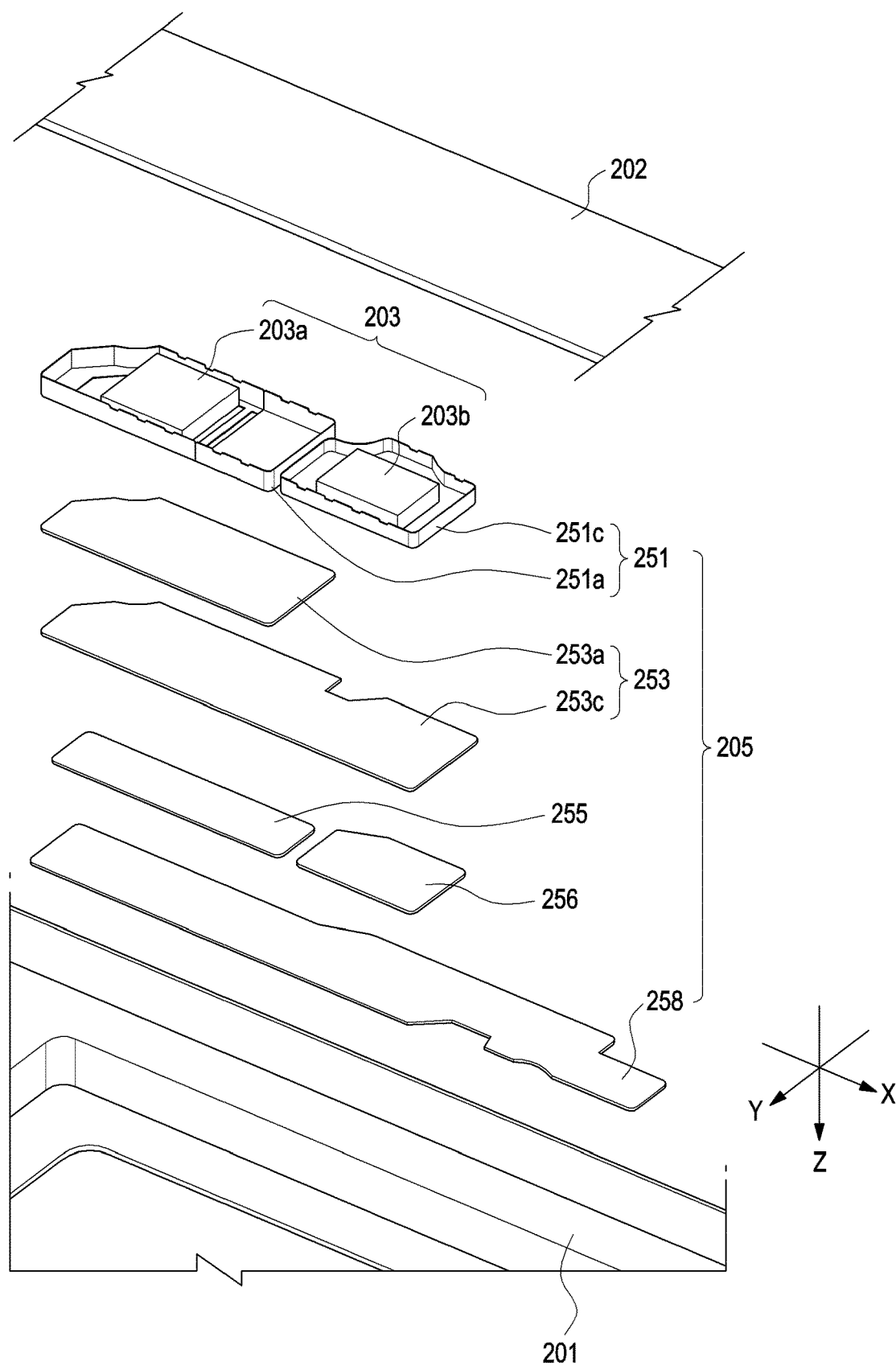
FIG. 4 is an exploded perspective view illustrating a heat dissipation structure included in an electronic device according to various embodiments of the present invention.

FIG. 4 is an exploded perspective view illustrating a heat dissipation structure 205 included in an electronic device (e.g., the electronic device 101 of FIG. 2) according to various embodiments of the present invention.

Referring to FIG. 4, according to various embodiments of the present invention, a heat dissipation structure 205 included in an electronic device (e.g., the electronic device 101 of FIG. 2) may be disposed between a housing 201 (e.g., the housing 103 of FIG. 2) and a circuit board 202 and may surround at least one heating component 203. According to an embodiment, heat produced from the at least one heating component 203 may be transferred through the heat dissipation structure 205 to the housing 201. The housing 201 may cool the heat produced from the heating component 203.

According to an embodiment, the housing 103 may include a cooling member (e.g., the cooling member 215 of FIG. 5). According to an embodiment, the cooling member (e.g., the cooling member 215 of FIG. 5) may be attached onto the bottom surface of the display (e.g., the display 160 of FIG. 1). The cooling member (e.g., the cooling member 215 of FIG. 5) may be formed of a metal, e.g., stainless steel (SUS). According to an embodiment, heat from the at least one heating component 203 may be transferred through the heating component 205 to the cooling member (e.g., the cooling member 215 of FIG. 5). The cooling member (e.g., the cooling member 215 of FIG. 5) may cool heat produced from the heating component 203.

According to an embodiment, the at least one heating component 203 may include a first heating component 203a and a second heating component 203b. For example, the first heating component 203a may be a processor (e.g., the processor 120 of FIG. 1). The first heating component 203a may produce less heat than the second heating component 203b. According to an embodiment, the second heating component 203b may be driven at low power, producing little heat. For example, the second heating component 203b may be a socket where a sim card or a memory card, e.g., SD card, is placed. According to an embodiment, the socket may have at least one or more memory cards or a sim card plugged therein. The heating components 203 may be mounted on the circuit board 202. The heat dissipation structure 205 may include a shield can 251, a shielding member 253, a second heat conducting member 255 and 256, and a third heat conducting member 258.

According to an embodiment, the shield can 251 may include a first shield can 251a and a second shield can 251c. The first shield can 251a may surround the side surface of the first heating component 203a. The second shield can 251c may surround the second heating component 203b.

According to an embodiment, the shielding member 253 may include a conducting member 253a and a first heat conducting member 253c. The first conducting member 253a may cover a first surface (e.g., the first surface 231a of FIG. 5) of the first heating component 203a. The conducting member 253a may be formed of metal, e.g., copper (Cu). For example, the conducting member 253a may be shaped as a copper bar. According to an embodiment, the conducting member 253a may be formed of a copper tape. The conducting member 253a may shield off electromagnetic waves created from the first heating component 203a.

According to an embodiment, the first heat conducting member 253c may be larger in thermal conductivity in the first direction than in the second direction. For example, the first heat conducting member 253c may be formed of graphite. The first heat conducting member 253c may dissipate heat produced from the at least one heating component 203 in the first direction. The first direction is not limited to one direction but may rather be a plane direction. For example, heat produced from the at least one heating component 203 may be dissipated in the X axis direction and the Y axis direction which are parallel to the first surface (e.g., the first surface 231a of FIG. 5) of the heating component 203. The shielding member 253 may be formed of a stack of the conducting member 253a and the first heat conducting member 253c. According to an embodiment, the order in which the conducting member 253a and the first heat conducting member 253c are stacked is not limited to a particular one. According to an embodiment, the first heat conducting member 253c may be larger in area than the conducting member 253a. For example, the conducting member 253a may have an area corresponding to the area of the first shield can 251a, and the first heat conducting member 253c may have an area corresponding to the area of the second shield can 251c. As the first heat conducting member 253c is larger in area than the conducting member 253a, it may receive heat produced by the second heating component 203b as well as heat produced by the first heating component 203a. According to an embodiment, the second heat conducting member 255 and 256 may be formed of a solid thermal interface material (TIM). The second heat conducting member 255 and 256 may be disposed between the shielding member 253 and the housing 201 to transfer heat received from the shielding member 253 to the housing 201 in the second direction (Z axis) perpendicular to the first direction (e.g., X axis or Y axis direction). The second heat conducting member 255 and 256 may include a second-first heat conducting member 255 and a second-second heat conducting member 256. According to an embodiment, where the first heating component 203a is a processor (e.g., the processor 120 of FIG. 1), the second-first heat conducting member 255 may be disposed on the area of the first heating component 203a. The second-second heat conducting member 256 may be disposed on the area of the second heating component 203b. As the second-first heat conducting member 255 may be thicker than the second-second heat conducting member 256, the second-first heat conducting member 255 may be smaller in thermal conductivity than the second-second heat conducting member 256. The second-second heat conducting member 256 may be spaced apart from the second-first heat conducting member 255. According to an embodiment, the material of the second-first heat conducting member 255 may be smaller in thermal conductivity than the second-second heat conducting member 256. According to an embodiment, the second-first heat conducting member 255 may be connected with the second-second heat conducting member 256. According to an embodiment, the second heat conducting member 255 and 256 may have elasticity and serve as a cushion between the shielding member 253 and the housing 201.

Figure 5A:
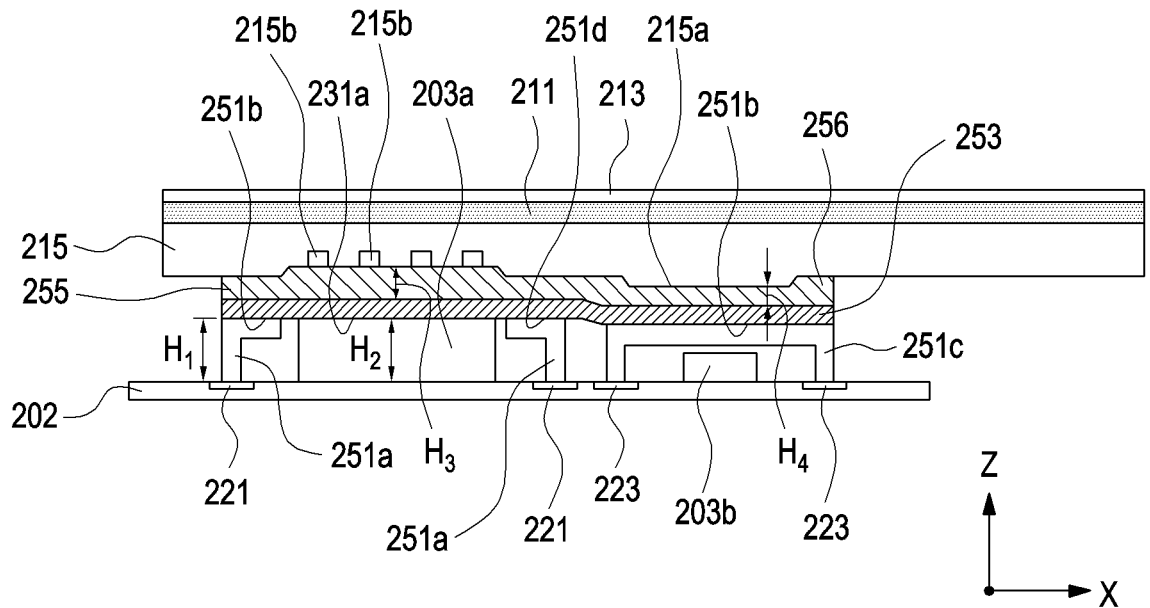
FIG. 5A is a cross-sectional view illustrating a heat dissipation structure included in an electronic device according to various embodiments of the present invention.

FIG. 5A is a cross-sectional view illustrating a heat dissipation structure (e.g., the heat dissipation structure 205 of FIG. 4) included in an electronic device (e.g., the electronic device 101 of FIG. 2) according to various embodiments of the present invention.

Referring to FIG. 5A, according to various embodiments of the present invention, an electronic device (e.g., the electronic device 101 of FIG. 2) may include a circuit board 202, shield cans 251a and 251c, at least one heating component 203a and 203b, a shielding member 253, a second heat conducting member 255, a cooling member 215, a display 211, and a front cover 213. According to an embodiment, the heat dissipation structure (e.g., the heat dissipation structure 205 of FIG. 4) may include the shielding member 253 and the second heat conducting member 255 and 256.

According to an embodiment, the shield cans 251a and 251c may be soldered to the circuit board 202. For example, the circuit board 202 may include solder parts 221 and 223 to electrically connect the shield can 251a with the circuit board 202. According to an embodiment, the first surfaces 251b and 251d of the shield cans 251a and 251c may abut the conducting member (e.g., the conducting member 253a of FIG. 4) of the shielding member 253. The circuit board 202, the shield cans 251a and 251c, the shielding member 253, and the conducting member (e.g., the conducting member 253a of FIG. 4) may be grounded together while surrounding the first heating component 203a, thereby shielding off electromagnetic waves produced from the first heating component 203a.

According to an embodiment, the first surface 251b of the shield can 251a may have a first height H1 from the first surface 231a of the circuit board 202. The first surface of the at least one heating component 203a may have a second height H2 from the first surface of the circuit board 202. The first height H1 may be identical to the second height H2. For example, the first surface 251b or 251d of the shield can 251a may have the same flat surface as the first surface 231a of the at least one heating component. The shielding member 253 may be formed in a plate shape contacting the first surface 251b of the shield can 251a and the first surface 231a of the at least one heating component 203a.

According to an embodiment, unlike the second heat conducting member 255 shown in FIG. 4, the second heat conducting member 255 and 256, if the second-first heat conducting member 255 and the second-second heat conducting member 256 are integrally formed with each other, may make no difference in thermal conductivity due to the thicknesses H3 of the second-first heat conducting member 255 and H4 of the second-second heat conducting member 256. In the cooling member 215, as a step 215a is formed on the second-second heat conducting member 256, differences in heat volume and thermal conductivity may be produced in the second-first and second-second heat conducting members 255 and 256 by the cooling member 215.

According to an embodiment, the display 211 may output images on the front cover 213. The cooling member 215 may be coupled to the bottom surface of the display 211. The cooling member 215 may be formed of a metal, such as stainless steel (SUS). In the cooling member 215, a plurality of holes 411 may be formed over the first heating component 203a. The plurality of holes 411 may prevent transfer in the second direction (Z axis direction) of heat produced from the first heating component 203a.

Figure 5B:
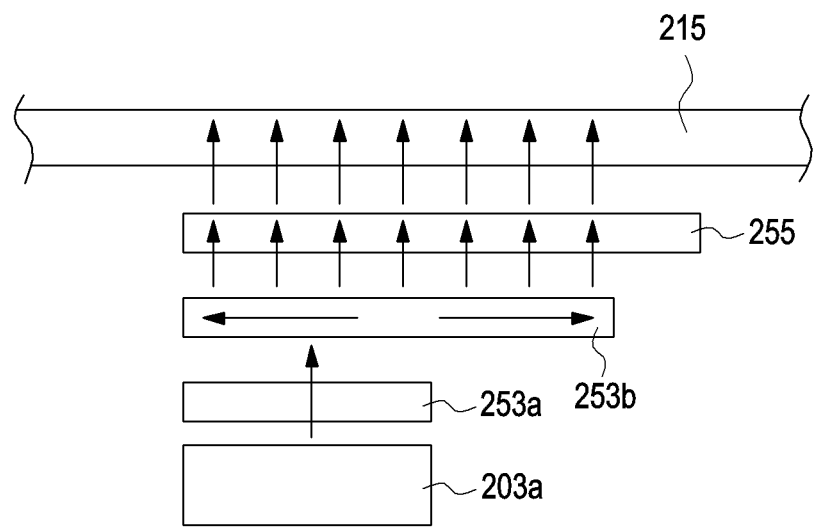
FIG. 5B is a cross-sectional view schematically illustrating an example in which heat is transferred by a heat dissipation structure as shown in FIG. 5A, according to various embodiments of the present invention.

FIG. 5B is a cross-sectional view schematically illustrating an example in which heat is transferred by a heat dissipation structure as shown in FIG. 5A, according to various embodiments of the present invention.

Referring to FIG. 5B, the heating component 203a may emit heat. The heat emitted from the heating component 203a may be transferred to the conducting member 253a. The heat transferred to the conducting member 253a may be transferred to the first heat conducting member 253b. The heat transferred to the first heat conducting member 253b may dissipate from the first heat conducting member 253b along the plane direction of the first heat conducting member 253b. The heat dissipated from the first heat conducting member 253b may be transferred to the second heat conducting member 255. The heat transferred to the second heat conducting member 255 may be transferred to the cooling member 215 and cooled down.

Figure 5C:
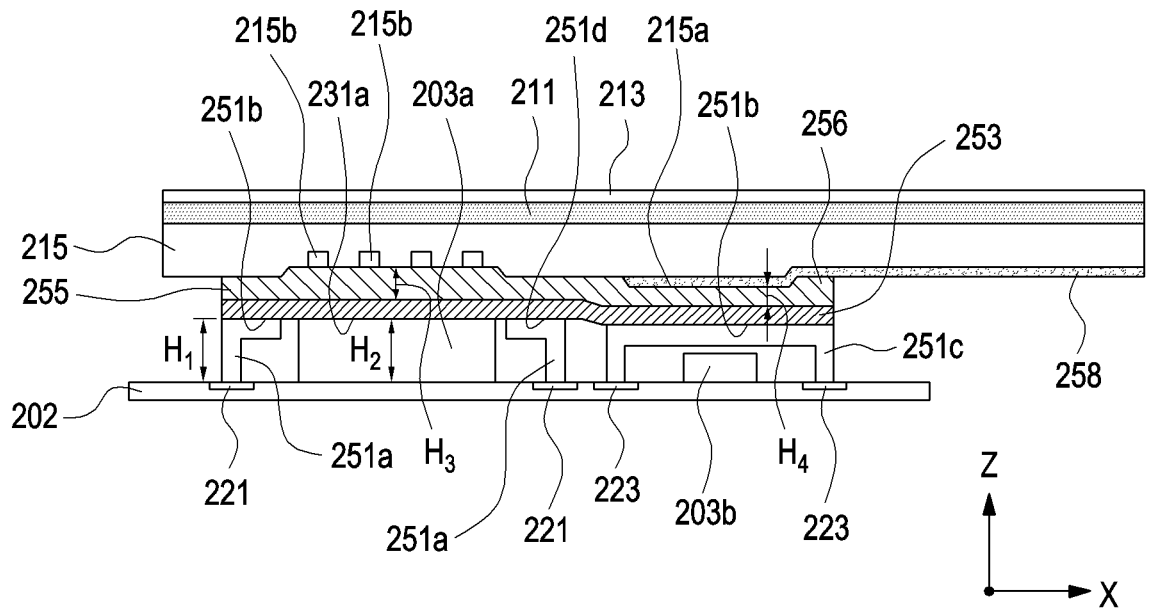
FIG. 5C is a cross-sectional view illustrating a heat dissipation structure included in an electronic device according to various embodiments of the present invention.

FIG. 5C is a cross-sectional view illustrating a heat dissipation structure included in an electronic device according to various embodiments of the present invention.

Referring to FIG. 5C, according to various embodiments of the present invention, an electronic device (e.g., the electronic device 101 of FIG. 2) may include a circuit board 202, shield cans 251a and 251c, at least one heating component 203a and 203b, a shielding member 253, a second heat conducting member 255, a third heat conducting member 258, a cooling member 215, a display 211, and a front cover 213.

According to an embodiment, the third heat conducting member 258 may be disposed between the second heat conducting member 255 or 256 and the housing 201. The third heat conducting member 258 may receive heat from the second heat conducting member 255 or 256 and transfer the heat in the X axis direction and Y axis direction. According to an embodiment, the third heat conducting member 258 may be formed of graphite. According to an embodiment, the third heat conducting member 258 may be thinner than the conducting member 253a.

Figure 5D:
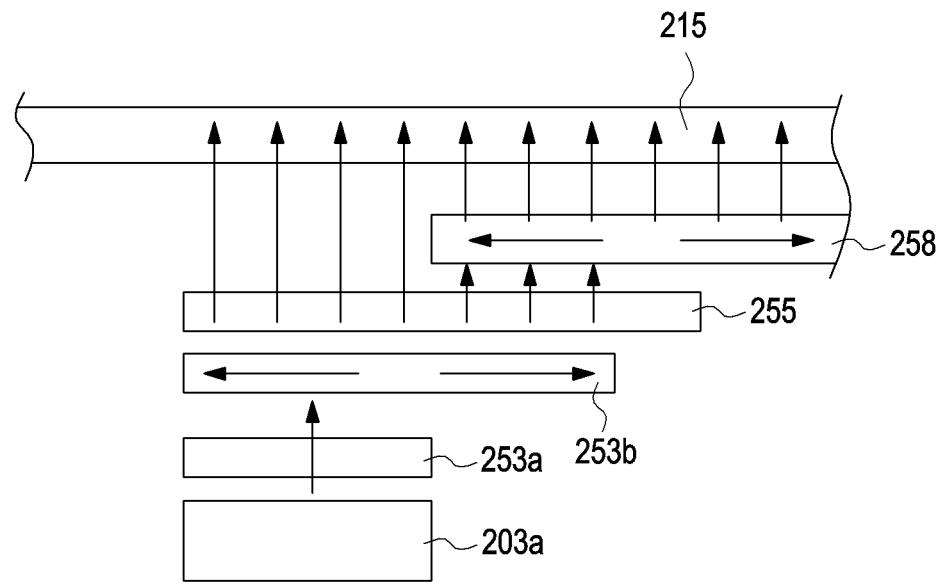
FIG. 5D is a cross-sectional view schematically illustrating an example in which heat is transferred by a heat dissipation structure as shown in FIG. 5C, according to various embodiments of the present invention.

FIG. 5D is a cross-sectional view schematically illustrating an example in which heat is transferred by a heat dissipation structure as shown in FIG. 5C, according to various embodiments of the present invention.

Referring to FIG. 5D, the heating component 203a may emit heat. The heat emitted from the heating component 203a may be transferred to the conducting member 253a. The heat transferred to the conducting member 253a may be transferred to the first heat conducting member 253b. The heat transferred to the first heat conducting member 253b may dissipate from the first heat conducting member 253b along the plane direction of the first heat conducting member 253b. The heat dissipated from the first heat conducting member 253b may be transferred to the second heat conducting member 255. The heat transferred to the second heat conducting member 255 may be transferred to the cooling member 215 and cooled down or may be transferred to the third heat conducting member 258. The heat transferred to the third heat conducting member 258 may dissipate from the third heat conducting member 253b along the plane direction of the third heat conducting member 258. The heat dissipated from the third heat conducting member 258 may be transferred to the cooling member 215 and cooled down. Heat from the third heat conducting member 258, before directly transferred from the second heat conducting member 255 to the cooling member 215, may be dissipated from the third heat conducting member 258, so that heat from the heating component 203a may be cooled down using the overall cooling member 215.

Figure 6:
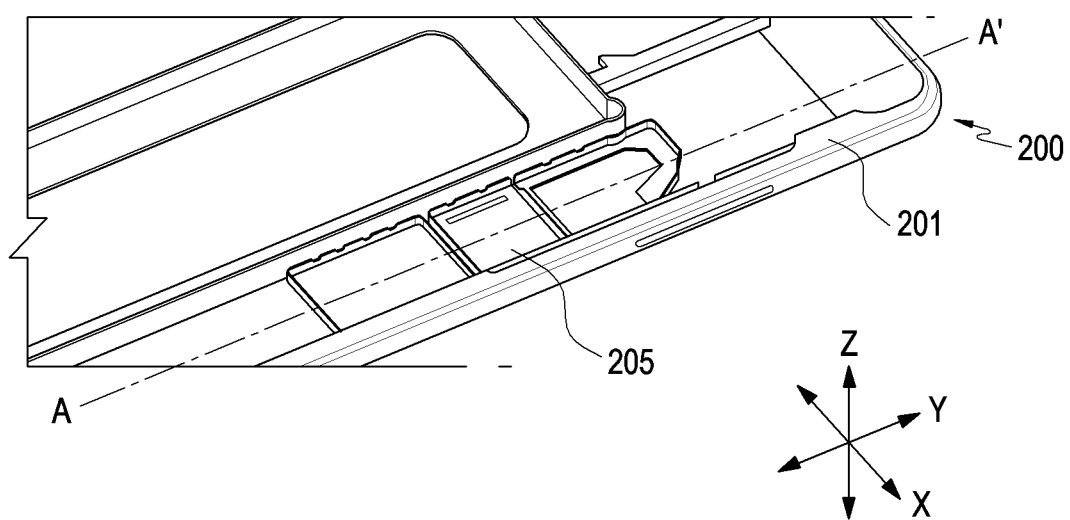
FIG. 6 is a perspective view illustrating an example in which a heat dissipation structure is mounted in a housing according to various embodiments of the present invention.
Figure 7:
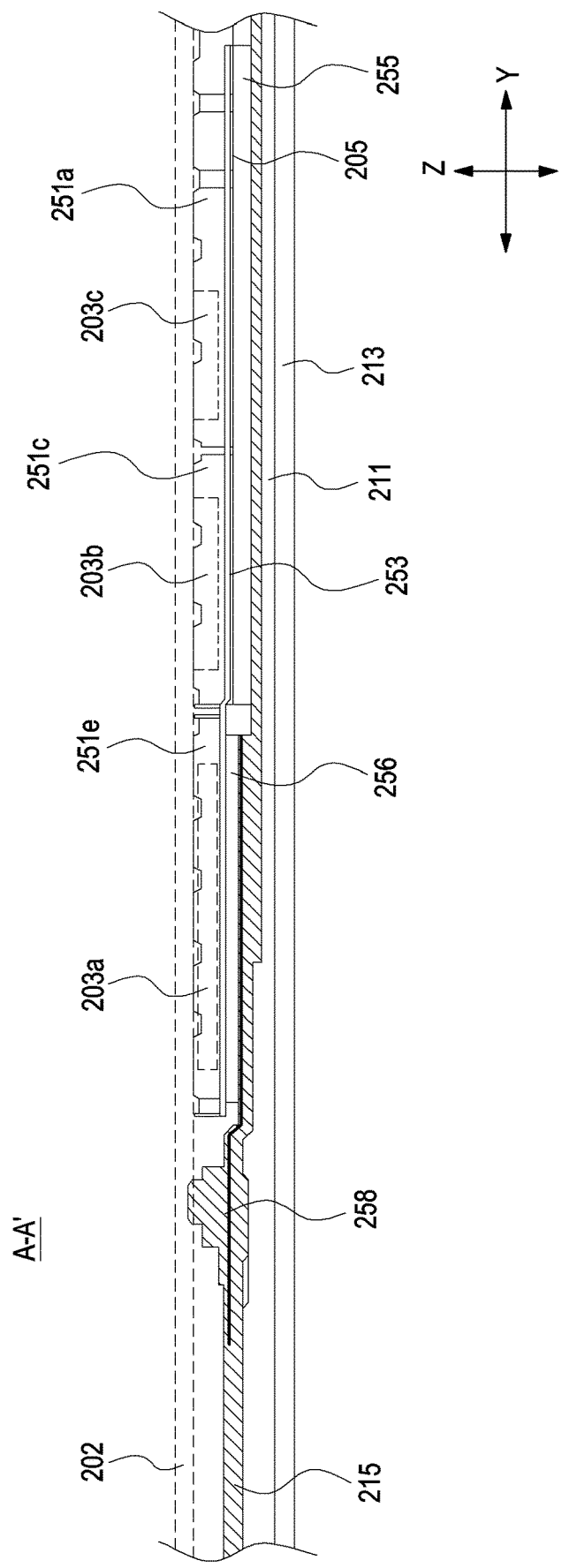
FIG. 7 is a cross-sectional view taken along line A-A' of FIG. 6, according to various embodiments of the present invention.

FIG. 6 is a perspective view illustrating an example in which a heat dissipation structure is mounted in a housing according to various embodiments of the present invention. FIG. 7 is a cross-sectional view taken along line A-A' of FIG. 6, according to various embodiments of the present invention.

Referring to FIGS. 6 and 7, according to various embodiments of the present invention, an electronic device 200 may include a housing 201, a circuit board 202, a front cover 213, a display 211, and a heat dissipation structure 205. The heat dissipation structure 205 may include a shielding member 253, a second heat conducting member 255 and 256, and a third heat conducting member 258.

The flow of heat generated from at least one heating component 203a, 203b, and 203c is described with reference to FIGS. 6 and 7. According to an embodiment, the at least one heating component 203a, 203b, and 203c may include a first heating component 203a, a second heating component 203b, and a third heating component 203c. The first heating component 203a may be a processor (e.g., the processor 120 of FIG. 1). The second heating component 203b may be a memory (e.g., the memory 130 of FIG. 1). The third heating component 203c may be an RF circuitry component. According to an embodiment, the first heating component 203a may be surrounded by a first shield can 251e, the second heating component 203b may be surrounded by a second shield can 251c.

According to an embodiment, heat produced from the first and second heating components 203a and 203c may be transferred through a first heat conducting member of the shielding member 253 to the second shield can 251c. Heat transferred to the first heat conducting member of the shielding member 253 may flow in the plane direction which is the X axis direction and Y axis direction along the first heat conducting member of the shielding member 253. For example, heat transferred to the first heat conducting member of the shielding member 253 may be evenly spread all over the shielding member 253. Heat flowing in the X and Y axis directions along the shielding member 253 may be transferred to the second heat conducting member 255 or 256. The heat transferred to the second heat conducting member 255 or 256 may be transferred to the housing 201 along the Z axis direction, thereby reducing the likelihood that heat concentrates onto a portion of the housing 201, namely, a hot spot occurs. For example, the portion of the housing 201, where a hot spot occurs, may be the position corresponding to the first and third heating components 203a and 203c.

Figure 8A:
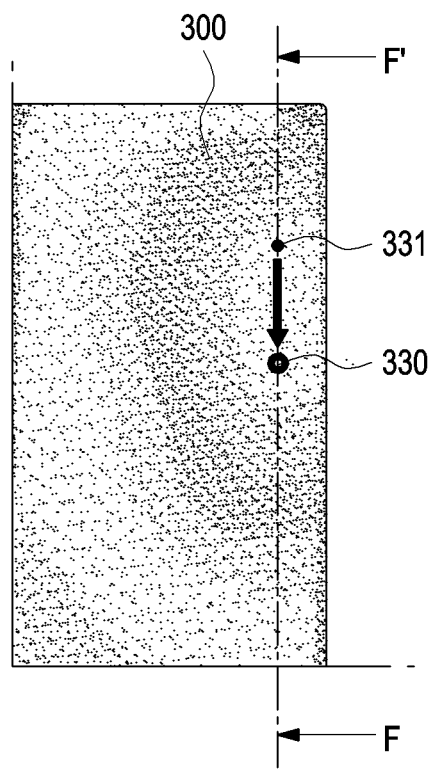
FIG. 8A is a plan view illustrating heat on the surface of a housing of an electronic device according to various embodiments of the present invention.
Figure 8B:
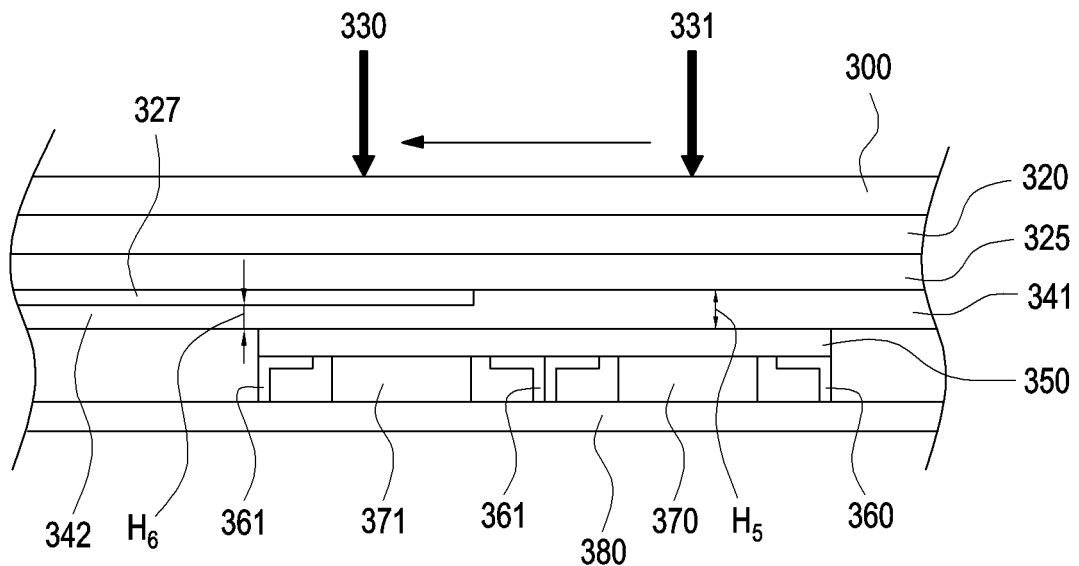
FIG. 8B is a cross-sectional view taken along line F-F' of FIG. 8A, according to various embodiments of the present invention.

FIG. 8A is a plan view illustrating heat on the surface of a housing (e.g., the housing 103 of FIG. 2) of an electronic device (e.g., the electronic device 101 of FIG. 2) according to various embodiments of the present invention. FIG. 8B is a cross-sectional view taken along line F-F' of FIG. 8A, according to various embodiments of the present invention.

Referring to FIGS. 8A and 8B, according to various embodiments of the present invention, an electronic device (e.g., the electronic device 101 of FIG. 2) may include a circuit board 380, at least one heating component 370 and 371 (e.g., the processor 120 of FIG. 1), shield cans 360 and 361, a shielding member 350, a second heat conducting member 341 and 342, a cooling member 325, a display 320, and a front cover 300. The at least one heating component 370 and 371 may include a first heating component 370 and a second heating component 371. Heat produced from the first and second heating components 370 and 371 may be dissipated through the shielding member 350 in the plane direction of the shielding member 350. The second heat conducting member 341 and 342 may include a second-first heat conducting member 341 and a second-second heat conducting member 342. The thickness H5 of the second-first heat conducting member 341 may be larger than the thickness H6 of the second-second heat dissipation conducting member 342. Heat of the shielding member 350 may be transferred to the second-first and second-second heat conducting members 341 and 342. As the thickness of the second-first heat conducting member 341 is larger than the thickness of the second-second heat conducting member 342, heat received from the shielding member 350 may have a larger thermal conductivity in the second-second heat conducting member 342 than in the second-first heat conducting member 341. According to various embodiments of the present invention, the electronic device may prevent a hot spot from occurring in the position 331 corresponding to the first heating component 370. According to an embodiment, heat distributed over the surface of the front cover 300 of the electronic device may be spread over a broad area and, thus, the electronic device including the heating components, according to an embodiment, may prevent heat from concentrating onto a particular area of the front cover. According to an embodiment, as a portion 330 of the surface of the housing 300 of the electronic device, where heat is relatively high, is in a position different from the position corresponding to the at least one heating component 370 (e.g., the processor 120 of FIG. 1), heat concentration to the front cover 300 corresponding to the at least one heating component 370 (e.g., the processor 120) may be prevented.

According to an embodiment, the thickness H5 of the second-first heat conducting member 341 may be smaller than the thickness H6 of the second-second heat conducting member 342. As the thickness of the second-first heat conducting member 341 is smaller than the thickness of the second-second heat conducting member 342, heat received from the shielding member 350 may have a larger thermal conductivity in the second-first heat conducting member 341 than in the second-second heat conducting member 342. By the difference in thermal conductivity due to the thicknesses of the second-first and second-second heat conducting members 341 and 342, a hot spot may occur in the position 331 corresponding to the first heating component 370 in the front cover 300, so that a hot spot may be prevented from occurring in the position corresponding to the second heating component 371.

Figure 9A:
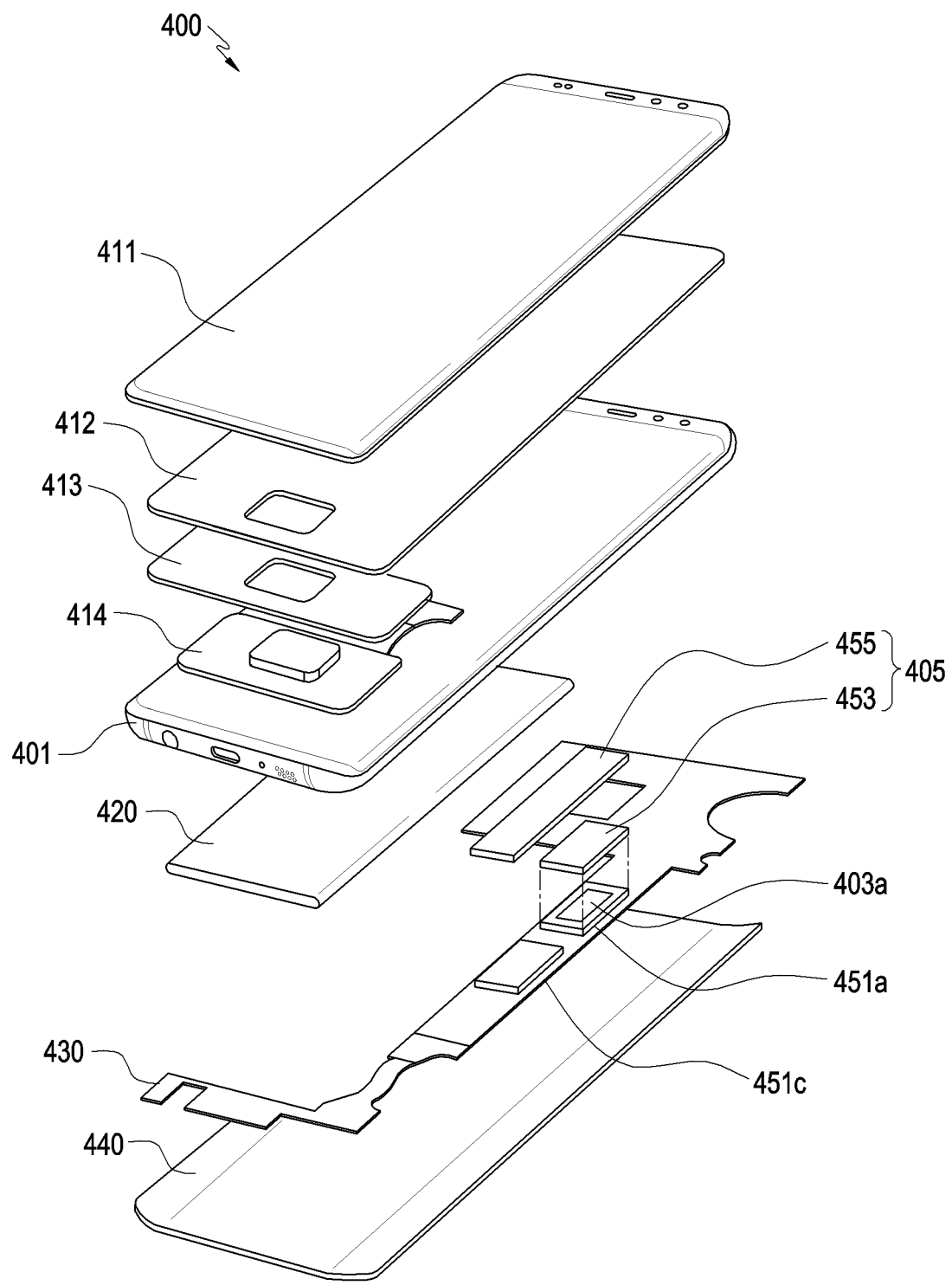
FIG. 9A is a perspective view illustrating an electronic device according to various embodiments of the present invention.

FIG. 9A is a perspective view illustrating an electronic device (e.g., the electronic device 101 of FIG. 2) according to various embodiments of the present invention.

Referring to FIG. 9A, according to various embodiments of the present invention, an electronic device (e.g., the electronic device 101 of FIG. 2) may include a housing 401, a digitizer panel 412, a touch panel 413, a sensor 414, a battery 420, a circuit board 430, at least one heating component 403a, and a heat dissipation structure 405.

According to an embodiment, the housing 401 may include a first surface 411 and a second surface 440. A front cover, the touch panel, and a display may be stacked on the first surface 411 of the housing 401. According to an embodiment, the order in which the touch panel and the display are stacked on the first surface 411 of the housing 401 is not limited to a particular one. The second surface 440 of the housing 401 may face away from the first surface 411. The digitizer panel 412 may be attached to the rear surface of the first surface 411 of the housing 401.

According to an embodiment, the touch panel 413 and the sensor 414 may be disposed between the digitizer panel 412 and the housing 401. The touch panel 413 and the sensor 414 may perform functions as a home key or other functional keys by the user's touch. According to an embodiment, the circuit board 430 may be disposed between the housing 401 and the second surface 440 of the housing 401.

According to an embodiment, the at least one heating component 403a may be mounted on the circuit board 430. The at least one heating component 403a may be surrounded by the shield cans 451a and 451c. The shield can 451a may include a first shield can 451a with an opening and a second shield can 451c of a closed type.

According to an embodiment, the heat dissipation structure 405 may include the shielding member 453 and the second heat conducting member 455. The shielding member 453 may cover the opening of the first shield can 451a. The second heat conducting member 455 may be disposed between the shielding member 453 and the housing 401.

Figure 9B:
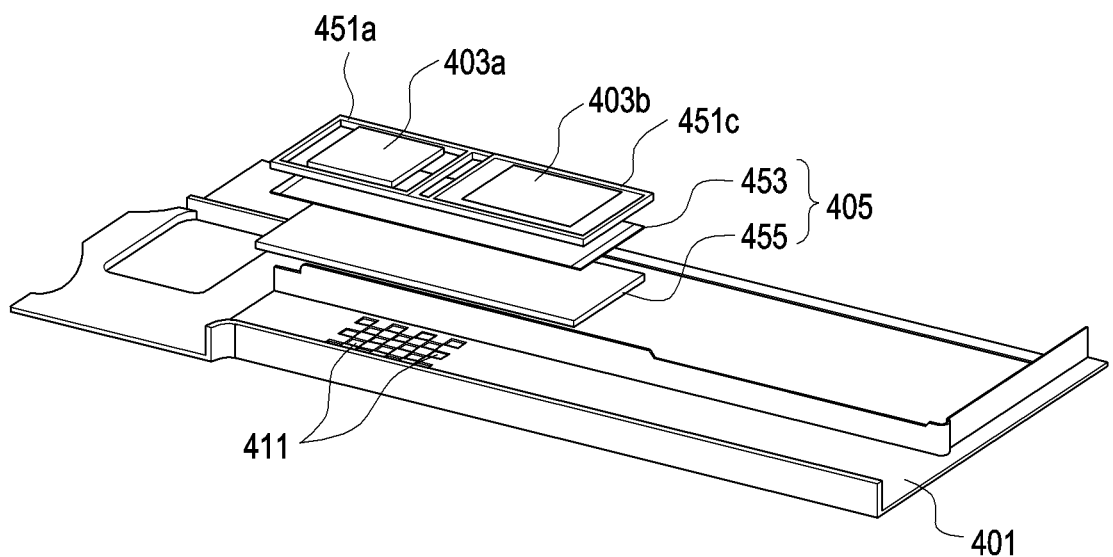
FIG. 9B is an exploded perspective view illustrating a heat dissipation structure included in an electronic device according to various embodiments of the present invention.

FIG. 9B is an exploded perspective view illustrating a heat dissipation structure (e.g., the heat dissipation structure 205 of FIG. 4) included in an electronic device (e.g., the electronic device 101 of FIG. 2) according to various embodiments of the present invention.

Referring to FIG. 9B, according to various embodiments of the present invention, an electronic device (e.g., the electronic device 101 of FIG. 2) may include a housing 401, at least one heating component 403, and a heat dissipation structure 405.

According to an embodiment, the housing 401 may include a plurality of holes 411. The plurality of holes 411 may be disposed in a position corresponding to part of the at least one heating component 403a.

According to an embodiment, the heat dissipation structure 405 may include a shield can 451, a shielding member 453, and a heat conducting member 455. As heat generated from the at least one heating component 403 passes through the shielding member 453 and the second heat conducting member 455 and then thermal conductivity is reduced by the air included in the plurality of holes 411, a hot spot may be prevented from occurring on a first surface (e.g., the first surface 411 of FIG. 9A) of the housing 401 corresponding to the at least one heating component 403.

According to an embodiment, the at least one heating component 403a and 403b may include a first heating component 403a and a second heating component 403b. The plurality of holes 411 may be disposed in the position corresponding to the first heating component 403a but not in the position corresponding to the second heating component 403b. For example, the housing 401 corresponding to the second heating component 403b lack the plurality of holes in the position corresponding to the second heating component 403b and, thus, its thermal conductivity may be larger than the thermal conductivity of the housing 401 formed with the plurality of holes 411.

Figure 10:
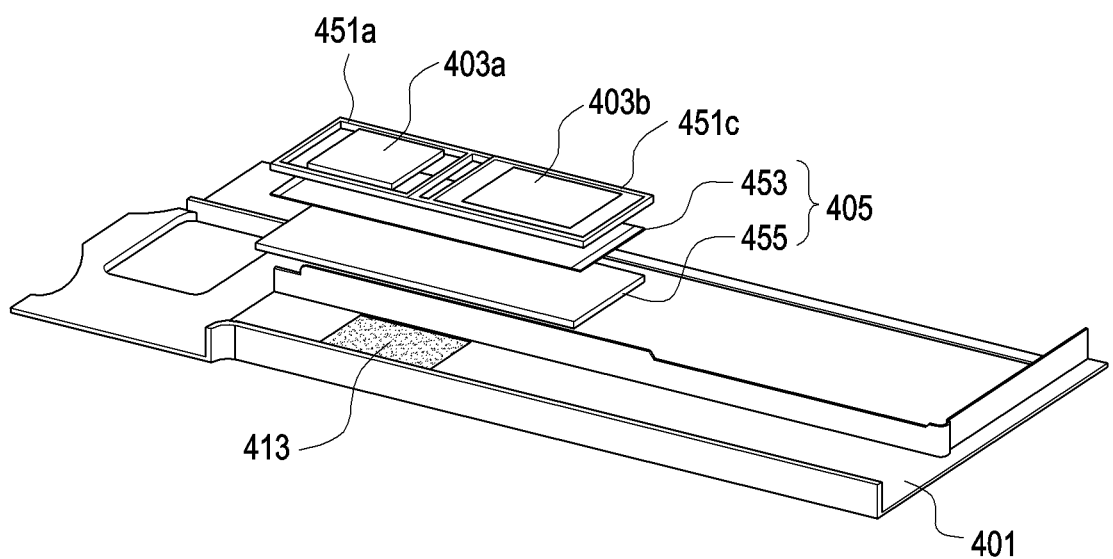
FIG. 10 is an exploded perspective view illustrating a heat dissipation structure included in an electronic device according to various embodiments of the present invention.

FIG. 10 is an exploded perspective view illustrating a heat dissipation structure (e.g., the heat dissipation structure 405 of FIG. 9B) included in an electronic device (e.g., the electronic device 101 of FIG. 2) according to various embodiments of the present invention.

Referring to FIG. 10, according to various embodiments of the present invention, an electronic device (e.g., the electronic device 101 of FIG. 2) may include a housing 401, at least one heating component 403, and a heat dissipation structure 405.

According to an embodiment, the housing 401 may include a heat insulation member 413. The heat insulation member 413 may be disposed in a position overlapping the at least one heating component 403. The heat insulation member 413 may be formed of a material with a lower thermal conductivity than the air. According to an embodiment, the heat insulation member 413 may be formed in the form of a film and be attached to the inner surface of the housing 401.

According to an embodiment, the heat dissipation structure 405 may include a shield can 451, a shielding member 453, and a heat conducting member 455. As heat generated from the at least one heating component 403a passes through the shielding member 453 and the second heat conducting member 455 and then thermal conductivity is reduced by the heat insulation member 413, a hot spot may be prevented from occurring on a first surface (e.g., the first surface 411 of FIG. 9A) of the housing 401 corresponding to the at least one heating component 403a.

According to an embodiment, the at least one heating component 403a and 403b may include a first heating component 403a and a second heating component 403b. The heat insulation member 413 may be disposed in the position corresponding to the first heating component 403a but not in the position corresponding to the second heating component 403b. For example, the housing 401 corresponding to the second heating component 403b lack the heat insulation member 413 in the position corresponding to the second heating component 403b and, thus, its thermal conductivity may be larger than the thermal conductivity of the housing 401 formed with the heat insulation member 413.

Figure 11:
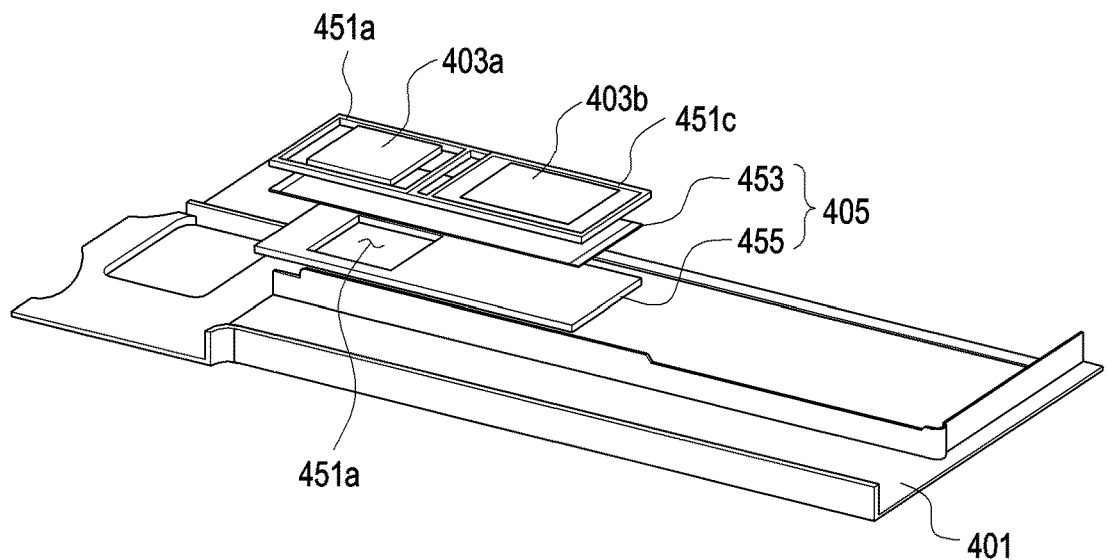
FIG. 11 is an exploded perspective view illustrating a heat dissipation structure included in an electronic device according to various embodiments of the present invention.

FIG. 11 is an exploded perspective view illustrating a heat dissipation structure (e.g., the heat dissipation structure 405 of FIG. 10) included in an electronic device (e.g., the electronic device 101 of FIG. 2) according to various embodiments of the present invention.

Referring to FIG. 11, according to various embodiments of the present invention, an electronic device (e.g., the electronic device 101 of FIG. 2) may include a housing 401, at least one heating component 403, and a heat dissipation structure 405.

According to an embodiment, the heat dissipation structure 405 may include a shield can 451, a shielding member 453, and a second heat conducting member 455. The second heat conducting member 455 may have an opening 451a in the area overlapping part of the at least one heating component 403a. As heat generated from the at least one heating component 403 passes through the shielding member 453 and the second heat conducting member 455 and then thermal conductivity is reduced by the air in the opening 451a, a hot spot may be prevented from occurring on a first surface (e.g., the first surface 411 of FIG. 9A) of the housing 401 corresponding to the at least one heating component 403a.

According to an embodiment, the at least one heating component 403a and 403b may include a first heating component 403a and a second heating component 403b. The opening 451a may be disposed in the position corresponding to the first heating component 403a but not in the position corresponding to the second heating component 403b. For example, the second heat conducting member 455 corresponding to the second heating component 403b lacks the opening 451a in the position corresponding to the second heating component 403b and, thus, its thermal conductivity may be larger than the thermal conductivity of the second heat conducting member 455 formed with the opening 451a.

Figure 12:
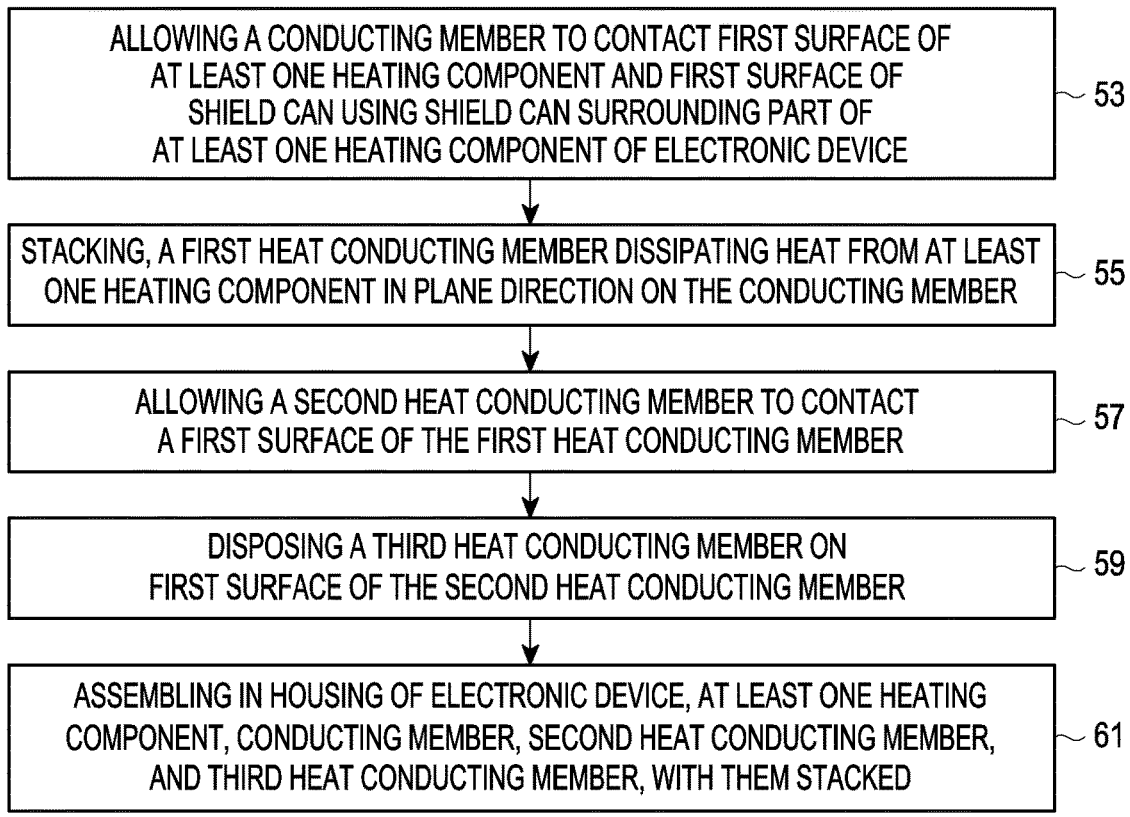
FIG. 12 is a flowchart illustrating a method of manufacturing an electronic device according to various embodiments of the present invention.

FIG. 12 is a flowchart illustrating a method of assembling an electronic device (e.g., the electronic device 400 of FIG. 9) according to various embodiments of the present invention.

Referring to FIG. 12, according to various embodiments of the present invention, a method of assembling an electronic device (e.g., the electronic device 400 of FIG. 9) may comprise attaching (53) a conducting member (e.g., the conducting member 253a of FIG. 5) to a first surface (e.g., the first surface 251b of the heating component of FIG. 5) of at least one heating component and a first surface (e.g., the first surface 231a of the shield can of FIG. 5) of a shield can using the shield can (e.g., the shield can 251 of FIG. 5) surrounding part of the at least one heating component (e.g., the heating component 203a of FIG. 5) of the electronic device (e.g., the electronic device 400 of FIG. 9), stacking (55) a first heat conducting member (e.g., the first heat conducting member 253c of FIG. 5) on the conducting member (e.g., the conducting member 253a of FIG. 5), the first heat conducting member (e.g., the first heat conducting member 253c of FIG. 5) dissipating heat from the at least one heating component in a first direction, allowing (57) a second heat conducting member (e.g., the second heat conducting member 255 and 256 of FIG. 5) to contact a first surface of the first heat conducting member (e.g., the first heat conducting member 253c of FIG. 5), disposing (59) a third heat conducting member (e.g., the third heat conducting member 258 of FIG. 5) on a first surface of the second heat conducting member (e.g., the second heat conducting member 255 and 256 of FIG. 5), and assembling (61) the at least one heating component (e.g., 203a of FIG. 5), the conducting member (e.g., the conducting member 253a of FIG. 5), the second heat conducting member (e.g., the second heat conducting member 255 and 256 of FIG. 5), and the third heat conducting member (e.g., the third heat conducting member 258 of FIG. 5) in the housing (e.g., the housing 401 of FIG. 9) of the electronic device, with the at least one heating component, the conducting member, the second heat conducting member, and the third heat conducting member stacked one over another.

Figure 13:
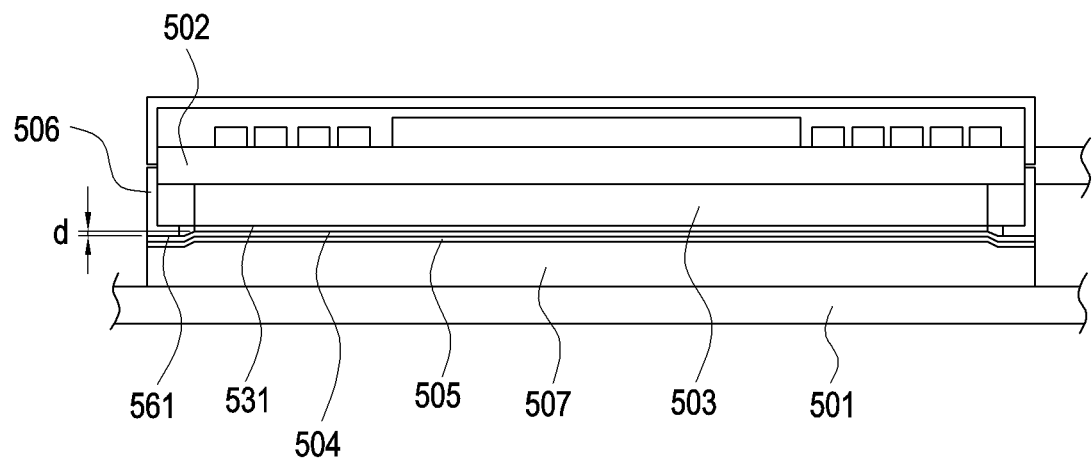
FIG. 13 is a cross-sectional view illustrating a portion of an electronic device according to various embodiments of the present invention.

FIG. 13 is a cross-sectional view illustrating a portion of an electronic device according to various embodiments of the present invention.

Referring to FIG. 13, according to various embodiments of the present invention, an electronic device may include a circuit board 502, a heating component 503, a shielding member 504, a second heat conducting member 505, a cooling member 505, a shield can 506, a display 507, and a front cover 501.

According to an embodiment, the first surface 561 of the shield can 560 may have a difference in height d from the first surface 531 of the heating component 503. For example, in a case where the height d falls within 0.02 mm, the shielding member 504 may stably be attached to the first surface 561 of the shield can 560 and the first surface 531 of the heating component 503.

Figure 14:
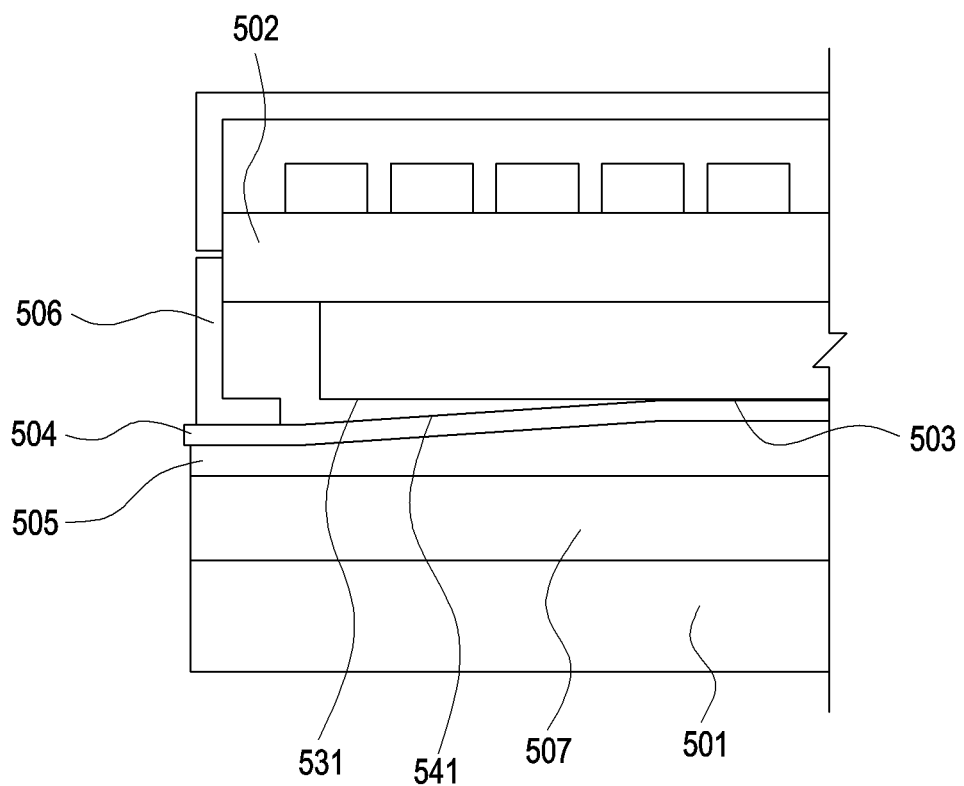
FIG. 14 is a cross-sectional view illustrating a portion of an electronic device according to various embodiments of the present invention.

FIG. 14 is a cross-sectional view illustrating a portion of an electronic device according to various embodiments of the present invention.

Referring to FIG. 14, according to various embodiments of the present invention, an electronic device may include a circuit board 502, a heating component 503, a shielding member 504, a second heat conducting member 505, a cooling member 505, a shield can 506, a display 507, and a front cover 501.

According to an embodiment, the first surface 561 of the shield can 560 may have a difference in height (e.g., height d of FIG. 13) from the first surface 531 of the heating component 503. For example, if the height (e.g., height d of FIG. 13) exceeds 0.02 mm, an interval may occur between the first surface 541 of the shielding member 504 and the first surface 531 of the heating component 503, so that transfer of heat produced from the heating component 503 to the shielding member 504 may be lowered.

Figure 15:
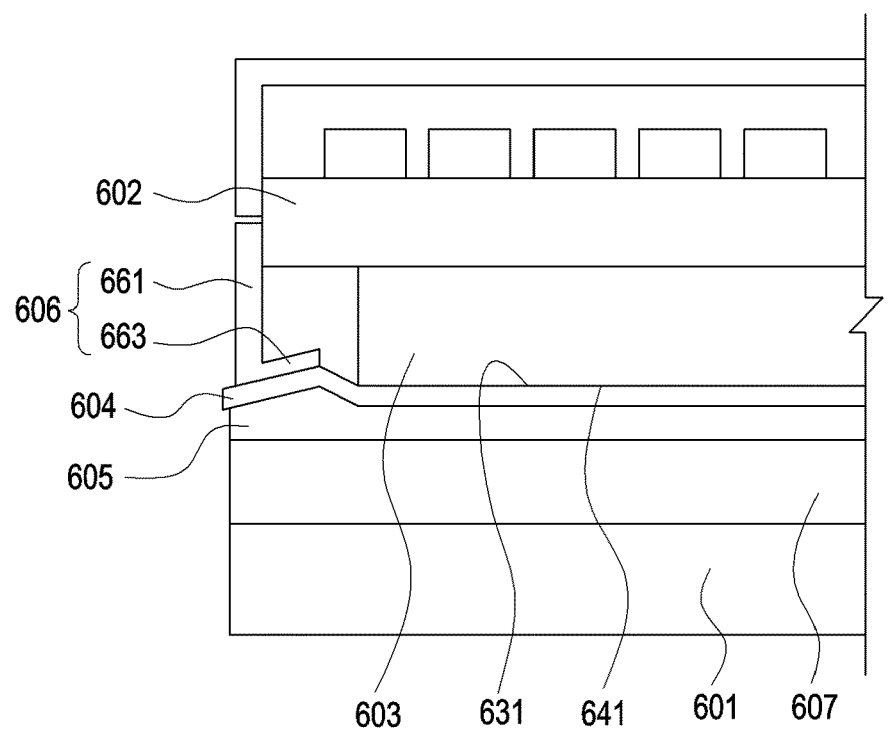
FIG. 15 is a cross-sectional view illustrating a portion of an electronic device according to various embodiments of the present invention.

FIG. 15 is a cross-sectional view illustrating a portion of an electronic device according to various embodiments of the present invention.

Referring to FIG. 15, according to various embodiments of the present invention, an electronic device may include a circuit board 602, a heating component 603, a shielding member 604, a second heat conducting member 605, a cooling member 605, a shield can 606, a display 607, and a front cover 601.

According to an embodiment, the shield can 606 may include a side part 661 and a rear part 663. The rear part 663 may be inclined on the side part 661. One surface 641 of the shielding member 604 may be attached to the rear part 663 and the heating component 603. According to an embodiment, as the second heat conducting member 605 is attached to the shielding member 604 while pressurizing the shielding member 604, one surface 641 of the shielding member 604 may stably be attached to the first surface 631 of the heating component 603 despite a difference in height between the shield can 606 and the heating component 603.

Figure 16:
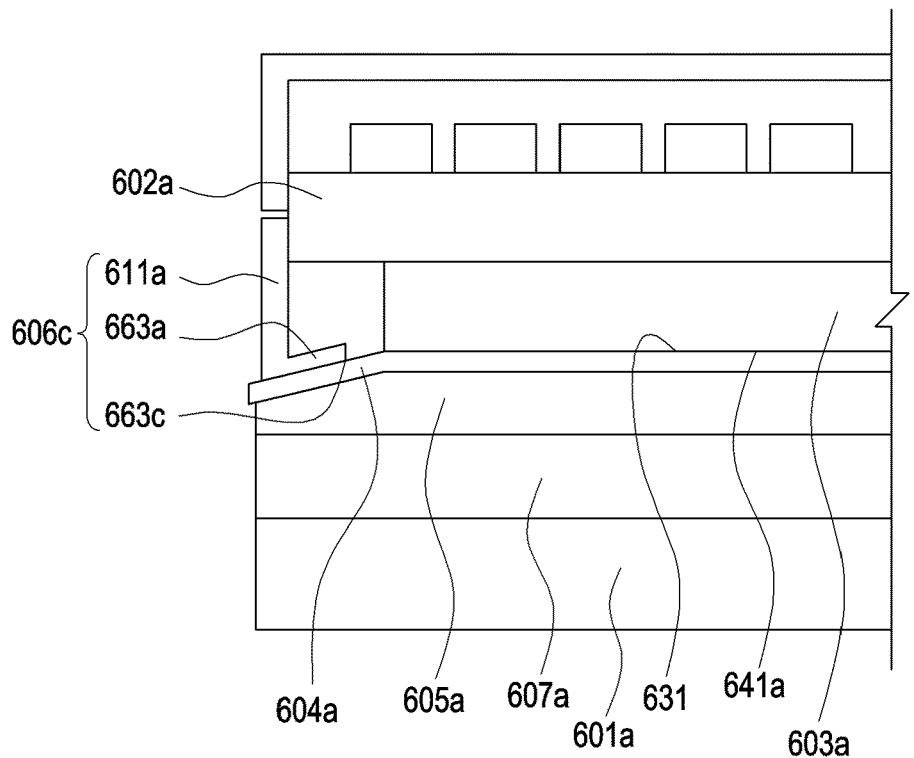
FIG. 16 is a cross-sectional view illustrating a portion of an electronic device according to various embodiments of the present invention.

FIG. 16 is a cross-sectional view illustrating a portion of an electronic device according to various embodiments of the present invention.

Referring to FIG. 16, according to various embodiments of the present invention, an electronic device may include a circuit board 602a, a heating component 603a, a shielding member 604a, a second heat conducting member 605a, a cooling member 605a, a shield can 606a, a display 607a, and a front cover 601a.

According to an embodiment, the shield can 606a may include a side part 661a and a rear part 663a. The rear part 663a may be inclined on the side part 661a. An end of the rear part 663a may have the same height as the first surface 631a of the heating component 603a. One surface 641a of the shielding member 604a may be attached to the rear part 663a and the heating component 603a. According to an embodiment, as the second heat conducting member 605a is attached to the shielding member 604a while pressurizing the shielding member 604a, one surface 641a of the shielding member 604a may stably be attached to the first surface 631a of the heating component 603a.

Figure 17:
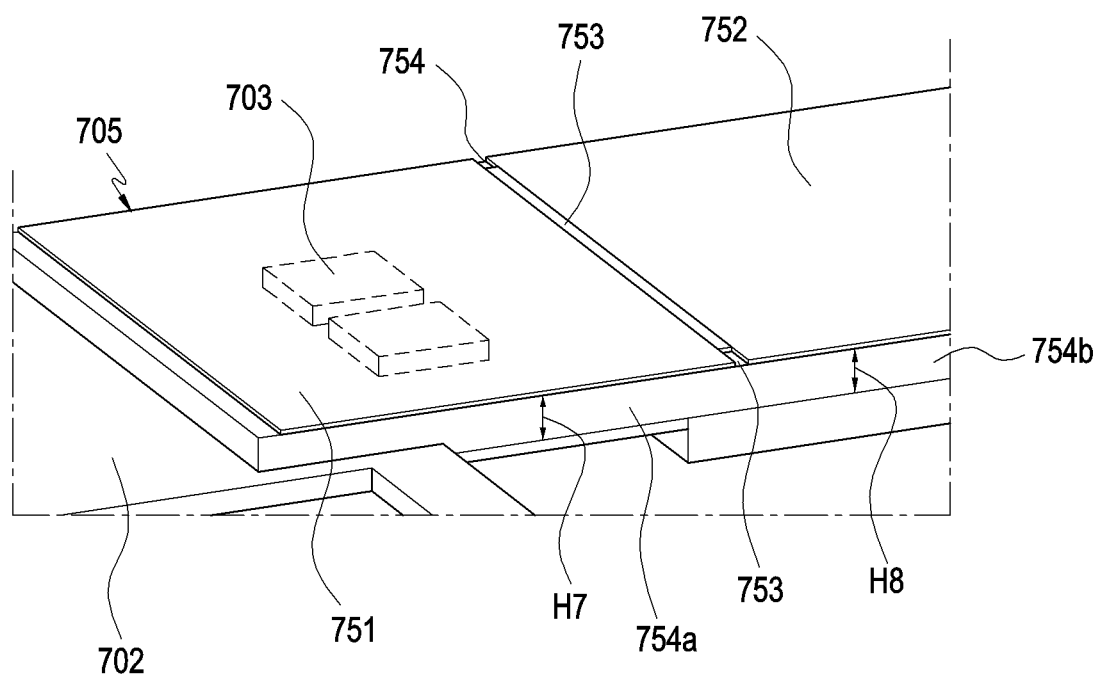
FIG. 17 is a perspective view illustrating a shielding member according to various embodiments of the present invention.

FIG. 17 is a perspective view illustrating a shielding member according to various embodiments of the present invention.

Referring to FIG. 17, according to various embodiments of the present invention, an electronic device may include a circuit board 702, a first shield can 754a, a second shield can 754b, and a shielding member 705.

According to an embodiment, the first shield can 754a may surround the side surface of at least one heating component 703. The second shield can 754b may surround the side surface of at least one heating component (not shown). The height H8 of the second shield can 754b may differ from the height H7 of the first shield can 754a.

According to an embodiment, the shielding member 705 may include a first shielding member 751 covering the first shield can 754a, a second shielding member 752 covering the second shield can 754b, and a connecting member 753 connecting the first shielding member 751 and the second shielding member 752. Due to the difference in height between the first shield can 754a and the second shield can 754b, the shielding member 705 may be not attached to the first and second shield cans 754a but and fall off.

According to an embodiment, the shielding member 705 may include at least one slit 754 formed between the first shielding member 751 and the second shielding member 752. For example, the slit 754 may be disposed between the first shield can 754a and the second shield can 754b. The slit 754 may prevent the connecting member 753 from deforming even when a difference in height occurs between the first shield can 754a and the second shield can 754b, thereby preventing the shielding member 705 from falling off the first and second shield cans 754a and 754b.

As set forth above, according to various embodiments of the present invention, an electronic device comprises a housing including a first surface, a second surface facing away from the first surface, and a cooling member disposed between the first surface and the second surface, a circuit board disposed inside the housing, at least one heating component mounted on the circuit board, a shield can surrounding part of the at least one heating component, a conducting member contacting a first surface of the at least one heating component, a first heat conducting member dissipating heat from the at least one heating component to a plane direction parallel with the first surface of the heating component, and a second heat conducting member contacting a first surface of the first heat conducting member, receiving the heat from the first heat conducting member in a second direction perpendicular to the plane direction, and transferring the heat to the cooling member.

According to an embodiment, the electronic device may further comprise a third heat conducting member contacting the second heat conducting member and dissipating the heat received from the second heat conducting member in the plane direction.

According to an embodiment, the conducting member may be connected with the shield can to shield an electromagnetic wave produced from the heating component.

According to an embodiment, the first heat conducting member may have a larger thermal conductivity in the plane direction than in the second direction.

According to an embodiment, the conducting member may be attached to the shield can, as well as to the at least one heating component.

According to an embodiment, the conducting member may be attached to the at least one heating component and the shield can and be formed in a plate shape.

According to an embodiment, the at least one heating component may include a processor.

According to an embodiment, the second heat conducting member may include a second-first heat conducting member overlapping a portion of the processor and a second-second heat conducting member not overlapping the processor and having a larger thermal conductivity than a thermal conductivity of the second-first heat conducting member.

According to an embodiment, a thickness of the second-first heat conducting member may be larger than a thickness of the second-second heat conducting member.

According to an embodiment, the second-second heat conducting member may be larger in area than the second-first heat conducting member.

According to an embodiment, the housing may include a plurality of holes in a position corresponding to part of the at least one heating component.

According to an embodiment, the plurality of holes may include air with a lower thermal conductivity than a material of the housing.

According to an embodiment, the housing may include a heat insulation member in a position corresponding to part of the at least one heating component.

According to an embodiment, the second heat conducting member may have an opening in a position corresponding to part of the at least one heating component. According to an embodiment, the conducting member may be larger in thermal conductivity than the second heat conducting member.

According to an embodiment, a thickness of the third heat conducting member may be smaller than a thickness of the conducting member.

According to an embodiment, heat generated from the at least one heating component may be conducted along the first heat conducting member in an X axis direction and a Y axis direction perpendicular to the X axis direction, and heat received from the conducting member to the second heat conducting member may be transferred to the third heat conducting member in a Z axis direction perpendicular to the X axis and the Y axis.

According to various embodiments of the present invention, a heat dissipation structure included in an electronic device comprises a circuit board on which at least one heating component of the electronic device is disposed, a shield can surrounding part of the at least one heating component, a conducting member contacting a first surface of the at least one heating component, a first heat conducting member dissipating heat from the at least one heating component to a plane direction parallel with the first surface of the heating component, and a second heat conducting member contacting a first surface of the first heat conducting member, receiving the heat from the first heat conducting member, and transferring the heat to a cooling member of the electronic device. According to an embodiment, the heat dissipation structure may further comprise a third heat conducting member contacting the second heat conducting member and dissipating the heat received from the second heat conducting member in the plane direction.

According to various embodiments of the present invention, a method of assembling an electronic device comprises allowing a conducting member to contact a first surface of at least one heating component and a first surface of a shield can using the shield can surrounding part of the at least one heating component of the electronic device, stacking a first heat conducting member on the conducting member, the first heat conducting member dissipating heat from the at least one heating component in a first direction, allowing a second heat conducting member to contact a first surface of the first heat conducting member, disposing a third heat conducting member on a first surface of the second heat conducting member, and assembling the at least one heating component, the conducting member, the second heat conducting member, and the third heat conducting member in the housing of the electronic device, with the at least one heating component, the conducting member, the second heat conducting member, and the third heat conducting member stacked one over another.

While the present invention has been shown and described with reference to exemplary embodiments thereof, it will be apparent to those of ordinary skill in the art that various changes in form and detail may be made thereto without departing from the spirit and scope of the present invention as defined by the following claims.

What is claimed is:

1. An electronic device, comprising:
   a housing including a first surface, a second surface facing away from the first surface, and a cooling member disposed between the first surface and the second surface;
   a circuit board disposed inside the housing;
   at least one heating component mounted on the circuit board;
   a shield can surrounding part of the at least one heating component;
   a conducting member contacting a first surface of the at least one heating component;
   a first heat conducting member configured to dissipate heat from the at least one heating component to a plane direction parallel with the first surface of the heating component; and
   a second heat conducting member contacting a first surface of the first heat conducting member, configured to receive the heat from the first heat conducting member in a second direction perpendicular to the plane direction, and transfer the heat to the cooling member,
   wherein the second heat conducting member is disposed between the cooling member and the first heat conducting member,
   wherein the at least one heating component includes a processor, and
   wherein the second heat conducting member includes a second-first heat conducting member overlapping a portion of the processor and a second-second heat conducting member not overlapping the processor and having a larger thermal conductivity than a thermal conductivity of the second-first heat conducting member.

2. The electronic device of claim 1, further comprising a third heat conducting member contacting the second heat conducting member and configured to dissipate the heat received from the second heat conducting member in the plane direction.

3. The electronic device of claim 1, wherein the conducting member is connected with the shield can to shield an electromagnetic wave produced from the heating component.

4. The electronic device of claim 1, wherein the first heat conducting member has a larger thermal conductivity in the plane direction than in the second direction.

5. The electronic device of claim 1, wherein the conducting member is attached to the shield can, as well as to the at least one heating component.

6. The electronic device of claim 5, wherein the conducting member is attached to the at least one heating component and the shield can and is formed in a plate shape.

7. The electronic device of claim 1, wherein a thickness of the second-first heat conducting member is larger than a thickness of the second-second heat conducting member.

8. The electronic device of claim 1, wherein the second-second heat conducting member is larger in area than the second-first heat conducting member.

9. The electronic device of claim 1, wherein the housing includes a plurality of holes in a position corresponding to part of the at least one heating component.

10. The electronic device of claim 9, wherein the plurality of holes include air with a lower thermal conductivity than a material of the housing.

11. The electronic device of claim 1, wherein the housing includes a heat insulation member in a position corresponding to part of the at least one heating component.

12. The electronic device of claim 1, wherein the second heat conducting member has an opening in a position corresponding to part of the at least one heating component.

13. The electronic device of claim 1, wherein the conducting member is larger in thermal conductivity than the second heat conducting member.

14. The electronic device of claim 2, wherein a thickness of the third heat conducting member is smaller than a thickness of the conducting member.

15. The electronic device of claim 2, wherein heat generated from the at least one heating component is conducted along the first heat conducting member in an X axis direction and a Y axis direction perpendicular to the X axis direction, and wherein heat received from the conducting member to the second heat conducting member is transferred to the third heat conducting member in a Z axis direction perpendicular to the X axis and the Y axis.

16. A heat dissipation structure included in an electronic device, the heat dissipation structure comprising:
   a circuit board on which at least one heating component of the electronic device is disposed;
   a shield can surrounding part of the at least one heating component;
   a conducting member contacting a first surface of the at least one heating component;
   a first heat conducting member configured to dissipate heat from the at least one heating component to a plane direction parallel with the first surface of the heating component; and
   a second heat conducting member contacting a first surface of the first heat conducting member, configured to receive the heat from the first heat conducting member, and transfer the heat to a cooling member of the electronic device,
   wherein the second heat conducting member is disposed between the cooling member and the first heat conducting member,
   wherein the at least one heating component includes a processor, and wherein the second heat conducting member includes a second-first heat conducting member overlapping a portion of the processor and a second-second heat conducting member not overlapping and having a larger thermal conductivity than a thermal conductivity of the second-first heat conducting member.

17. The heat dissipation structure of claim 16, further comprising a third heat conducting member contacting the second heat conducting member and configured to dissipate the heat received from the second heat conducting member in the plane direction.

18. A method of assembling an electronic device, the method comprising:
allowing a conducting member to contact a first surface of at least one heating component and a first surface of a shield can using the shield can surrounding part of the at least one heating component of the electronic device;
stacking a first heat conducting member on the conducting member, the first heat conducting member dissipating heat from the at least one heating component in a first direction;
allowing a second heat conducting member to contact a first surface of the first heat conducting member;
disposing a third heat conducting member on a first surface of the second heat conducting member; and
assembling the at least one heating component, the conducting member, the second heat conducting member, and the third heat conducting member in a housing of the electronic device, with the at least one heating component, the conducting member, the second heat conducting member, and the third heat conducting member stacked one over another,
wherein the second heat conducting member is disposed between a cooling member and the first heat conducting member,
wherein the at least one heating component includes a processor, and
wherein the second heat conducting member includes a second-first heat conducting member overlapping a portion of the processor and a second-second heat conducting member not overlapping and having a larger thermal conductivity than a thermal conductivity of the second-first heat conducting member.

* * * * *